(12) United States Patent
Sim et al.

(10) Patent No.: US 11,995,273 B2
(45) Date of Patent: May 28, 2024

(54) METHOD FOR MANUFACTURING DISPLAY DEVICE, DISPLAY DEVICE MANUFACTURED THEREBY, AND ELECTRONIC DEVICE INCLUDING THE SAME

(71) Applicant: Samsung Display Co., Ltd., Yongin-si (KR)

(72) Inventors: Jin Yong Sim, Seongnam-si (KR); Minji Kim, Seoul (KR); Hyunjun Cho, Seoul (KR); Yonghyuck Lee, Cheonan-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/700,931

(22) Filed: Mar. 22, 2022

(65) Prior Publication Data

US 2022/0397969 A1    Dec. 15, 2022

(30) Foreign Application Priority Data

Jun. 14, 2021   (KR) .......................... 10-2021-0077026

(51) Int. Cl.
*G06F 3/042*    (2006.01)
*G06F 3/044*    (2006.01)
(Continued)

(52) U.S. Cl.
CPC .............. *G06F 3/044* (2013.01); *G06F 3/042* (2013.01); *H10K 59/40* (2023.02); *H10K 71/00* (2023.02);
(Continued)

(58) Field of Classification Search
CPC ...................... G06F 3/044; G06F 3/042; G06F 2203/04102; G06F 1/1616; G06F 1/1652;
(Continued)

(56) References Cited

U.S. PATENT DOCUMENTS 9,639,121 B2    5/2017  Min et al.
9,801,290 B2   10/2017  Ahn
(Continued)

FOREIGN PATENT DOCUMENTS

KR   10-2016-0087972    7/2016
KR   10-2016-0144912   12/2016
(Continued)

OTHER PUBLICATIONS

Jens Pusch, Bernd Wohlmann, Elizaveta Martynova, and Holger Cebulla, Inorganic and Composite Fibers, 2018, pp. 31-51 and 131-163, Chapter 2—Carbon Fibers and Chapter 7—Glass Fibers.

(Continued)

*Primary Examiner* — Hong Zhou

(74) *Attorney, Agent, or Firm* — KILE PARK REED & HOUTTEMAN PLLC

(57) ABSTRACT

A method for manufacturing a display device may include providing a support layer and a display panel on a digitizer. The display panel may include a folding region that is folded with reference to a folding axis extending in a first direction. The providing of the support layer may include forming an opening penetrating the preliminary support layer by providing a laser or an abrasive agent to one surface of the preliminary support layer. A first width of the opening on the one surface in a second direction and a second width of the opening on another surface in a second direction may be different from each other, and the second direction is perpendicular to the first direction.

12 Claims, 18 Drawing Sheets

(51) Int. Cl.
    *H10K 59/40*     (2023.01)
    *H10K 71/00*     (2023.01)
    *H10K 77/10*     (2023.01)
    *H10K 102/00*     (2023.01)

(52) U.S. Cl.
    CPC .. *H10K 77/111* (2023.02); *G06F 2203/04102* (2013.01); *H10K 2102/311* (2023.02)

(58) Field of Classification Search
    CPC . G06F 3/0412; H01L 27/323; H01L 51/0097; H01L 51/56; H01L 2251/5338; H10K 59/40; H10K 71/00; H10K 77/111; H10K 2102/311; H10K 50/84; H10K 59/00; G09F 9/301
    See application file for complete search history.

(56) References Cited

U.S. PATENT DOCUMENTS

| | | | |
|---|---|---|---|
| 10,976,873 | B2 | 4/2021 | Shin et al. |
| 11,217,636 | B2 | 1/2022 | Ha et al. |
| 2018/0067522 | A1* | 3/2018 | Namkung .............. H05K 1/028 |
| 2018/0188861 | A1* | 7/2018 | Wu ........................ H01L 25/167 |
| 2019/0146556 | A1* | 5/2019 | Mizoguchi ............ G06F 1/1641 |
| | | | 361/679.27 |
| 2019/0319201 | A1 | 10/2019 | Goh et al. |
| 2020/0209998 | A1* | 7/2020 | Shin ..................... H04M 1/0268 |
| 2021/0036069 | A1* | 2/2021 | Ha ........................ G06F 1/1652 |
| 2021/0066626 | A1* | 3/2021 | Park ..................... H01L 27/3276 |
| 2021/0090475 | A1* | 3/2021 | Wang .................... G06F 1/1656 |
| 2021/0174711 | A1* | 6/2021 | Cho ...................... G06F 1/1616 |
| 2021/0279440 | A1* | 9/2021 | Son ....................... G06F 1/1684 |
| 2021/0382367 | A1* | 12/2021 | Hashimoto ........... G02F 1/1677 |
| 2022/0149337 | A1* | 5/2022 | Horiuchi .............. G06F 1/1652 |

FOREIGN PATENT DOCUMENTS

| | | | |
|---|---|---|---|
| KR | 10-2017-0003801 | | 1/2017 |
| KR | 10-2017-0087000 | | 7/2017 |
| KR | 10-2017-0087008 | | 7/2017 |
| KR | 10-2017-0127392 | | 11/2017 |
| KR | 10-2019-0120848 | | 10/2019 |
| KR | 10-2051803 | | 1/2020 |
| KR | 10-2020-0084495 | | 7/2020 |
| KR | 10-2021-0014812 | | 2/2021 |
| WO | WO-2020036279 | A1 * | 2/2020 .............. G06F 3/041 |

OTHER PUBLICATIONS https://en.wikipedia.org/wiki/Fibre-reinforced_plastic, retrieved on Jun. 7, 2021.

International Search Report, corresponding to International Application No. PCT/KR2022/008221, dated Sep. 19, 2022.

* cited by examiner

METHOD FOR MANUFACTURING DISPLAY DEVICE, DISPLAY DEVICE MANUFACTURED THEREBY, AND ELECTRONIC DEVICE INCLUDING THE SAME

CROSS-REFERENCE TO RELATED APPLICATION(S)

This U.S. non-provisional patent application claims priority to and the benefit of Korean Patent Application No. 10-2021-0077026 under 35 U.S.C. § 119, filed in the Korean Intellectual Property Office (KIPO) on Jun. 14, 2021, the entire contents of which are incorporated herein by reference.

BACKGROUND

The disclosure herein relates to a method for manufacturing a display device, the method including forming an opening, a display device manufactured thereby, and an electronic device including the same.

An electronic device includes a display device that displays an image. The display device displays various images on a display screen to provide information to a user. Generally, the display device displays information within a given screen. Recently, flexible display devices including a foldable display panel have been developed. A flexible display device is foldable, rollable, or bendable unlike a rigid display device. A flexible display device, of which the shape may be variously changed, may be carried regardless of a screen size, thereby improving user's convenience.

There is required a method for manufacturing a display device to readily fold a foldable flexible display device.

SUMMARY

The disclosure provides a display device manufacturing method including forming an opening in a support layer that includes a reinforcing fiber.

The disclosure also provides a display device including a support layer in which an opening is formed therein, and an electronic device including the display device.

An embodiment of the disclosure provides a method for manufacturing a display device, the method including preparing a digitizer; providing a support layer on the digitizer; and providing a display panel on the digitizer, the display panel including a folding region that is folded with reference to a folding axis extending in a first direction on the support layer, and a first non-folding region and a second non-folding region disposed with the folding region disposed between the first and second non-folding regions. The providing of the support layer may comprise preparing a preliminary support layer including one surface and another surface facing each other; and forming an opening penetrating the preliminary support layer by providing a laser or an abrasive agent to the one surface of the preliminary support layer, and a first width of the opening on the one surface in a second direction and a second width of the opening on the another surface in the second direction may be different from each other, and the second direction may be perpendicular to the first direction.

In an embodiment, the first width may be smaller than the second width.

In an embodiment, the one surface may be adjacent to the digitizer, and the another surface may be adjacent to the display panel.

In an embodiment, the preliminary support layer may include a first support portion corresponding to the first non-folding region, a second support portion corresponding to the second non-folding region, and a folding portion corresponding to the folding region, and the opening is formed in the folding portion.

In an embodiment, the forming of the opening may include providing the laser to the one surface of the preliminary support layer, and a difference between the first width and the second width may be in a range of about 10 um to about 20 um.

In an embodiment, the forming of the opening may include providing the abrasive agent to the one surface of the preliminary support layer, and a difference between the first width and the second width may be in a range of about 20 um to about 30 um.

In an embodiment, the forming of the opening may further include providing a patterning film on the one surface of the preliminary support layer before the providing of the abrasive agent.

In an embodiment, the patterning film may have a hole formed therein and through which the abrasive agent passes.

In an embodiment, the abrasive agent may include a plurality of abrasive particles having an average diameter in a range of about 20 um to about 50 um.

In an embodiment, the preliminary support layer may include reinforcing fibers arranged in a direction.

In an embodiment, the preparing of the preliminary support layer may include providing a first preliminary support layer including a first reinforcing fiber; providing a second preliminary support layer including a second reinforcing fiber on the first preliminary support layer; providing a third preliminary support layer including the first reinforcing fiber on the second preliminary support layer; and compressing the first preliminary support layer, the second preliminary support layer, and the third preliminary support layer which are sequentially stacked, and a long axis of the first reinforcing fiber may be arranged in the first direction, and a long axis of the second reinforcing fiber may be arranged in the second direction perpendicular to the first direction.

In an embodiment, on a plane, the opening may comprise a first edge parallel to a direction and a second edge extending from the first edge and having a curvature.

In an embodiment of the disclosure, a display device may include a display panel including a folding region that is folded with reference to a folding axis extending in a first direction, and a first non-folding region and a second non-folding region disposed with the folding region disposed between the first and second non-folding regions; a support layer disposed under the display panel and having an opening formed therein; and a digitizer disposed under the support layer, and the support layer includes one surface and another surface facing each other, a first width of the opening on the one surface in a second direction and a second width of the opening on the another surface may be different from each other, and the second direction may be perpendicular to the first direction.

In an embodiment, the display panel may include a sensing region spaced apart from the folding region.

In an embodiment, on a cross section perpendicular to the one surface and the another surface, the opening may have a trapezoidal shape or an inverted trapezoidal shape having a side surface inclined with respect to the one surface or the another surface.

In an embodiment, the opening may overlap the folding region in a plan view.

In an embodiment, the display device may further include a cover layer disposed on the another surface or the other surface. The cover layer may overlap the opening in a plan view.

In an embodiment, the display device may further include an adhesive layer disposed between the support layer and the digitizer and not overlapping the folding region in a plan view.

In an embodiment, the digitizer may include a first digitizer and a second digitizer. The first and second digitizers may not overlap the folding region in a plan view. The first and second digitizers may be spaced apart from each other.

In an embodiment of the disclosure, an electronic device may include a display device including a sensing region through which an optical signal passes; an electro-optical module disposed to correspond to the sensing region; a control module that controls the display device and the electro-optical module; and a housing in which the display device, the electro-optical module, and the control module are accommodated. The display device may include a display panel including a folding region that is folded with reference to a folding axis extending in a first direction, and a first non-folding region and a second non-folding region disposed with the folding region disposed between the first and second non-folding regions; a support layer disposed under the display panel and having an opening formed therein; and a digitizer disposed under the support layer; and the support layer includes one surface and another surface facing each other, a first width of the opening on the one surface in a second direction and a second width of the opening on another surface in the second direction may be different from each other, and the second direction may be perpendicular to the first direction.

In an embodiment, the support layer may include a first support portion corresponding to the first non-folding region, a second support portion corresponding to the second non-folding region, and a folding portion corresponding to the folding region, and the opening may be formed in the folding portion.

In an embodiment, on the cross section perpendicular to the one surface and the another surface, the opening may have a trapezoidal shape or an inverted trapezoidal shape having a side surface inclined with respect to the one surface or the another surface.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain principles of the disclosure. In the drawings.

DETAILED DESCRIPTION OF THE EMBODIMENTS

Figure 1A:
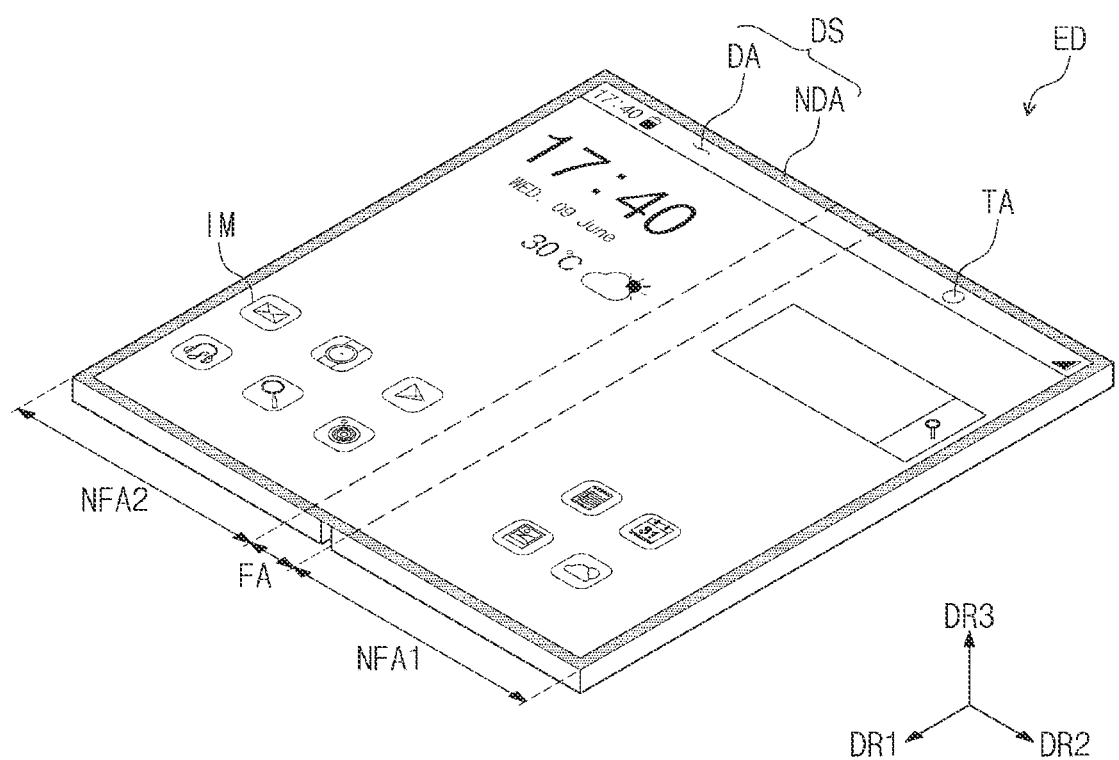
FIG. 1A is a schematic perspective view of an electronic device according to an embodiment.

In the specification, when an element (or a region, a layer, a portion, etc.) is referred to as being "on," "connected to," or "coupled to" another element, it means that the element may be directly disposed on, connected to, or coupled to the other element, or that a third element may be disposed therebetween.

Like reference numerals or symbols refer to like elements. Also, in the drawings, the thickness, the ratio, and the dimensions of elements may be exaggerated for an effective description of technical contents. The term "and/or" includes all combinations of one or more of which associated configurations may define.

It will be understood that, although the terms "first", "second", and the like may be used herein to describe various elements, these elements should not be limited by these terms. These terms are only used to distinguish one element from another. For example, a first element could be termed a second element, and, similarly, a second element could be termed a first element, without departing from the scope of example embodiments of the disclosure. The terms of a singular form may include plural forms (or meanings) unless the context clearly indicates otherwise.

In addition, terms such as "below", "lower", "above", and "upper" are used to describe the relationship between elements shown in the drawings. The terms are relative concepts and are described based on the directions indicated in the drawings.

It should be understood that the terms "comprise" and "have" are intended to specify the presence of stated features, integers, processes, operations, elements, components, or combinations thereof in the disclosure, but do not preclude the presence or addition of one or more other features, integers, processes, operations, elements, components, or combinations thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling, and vice versa.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by one of ordinary skill in the art to which the disclosure pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, embodiments of the disclosure will be described with reference to the accompanying drawings.

Figure 1B:
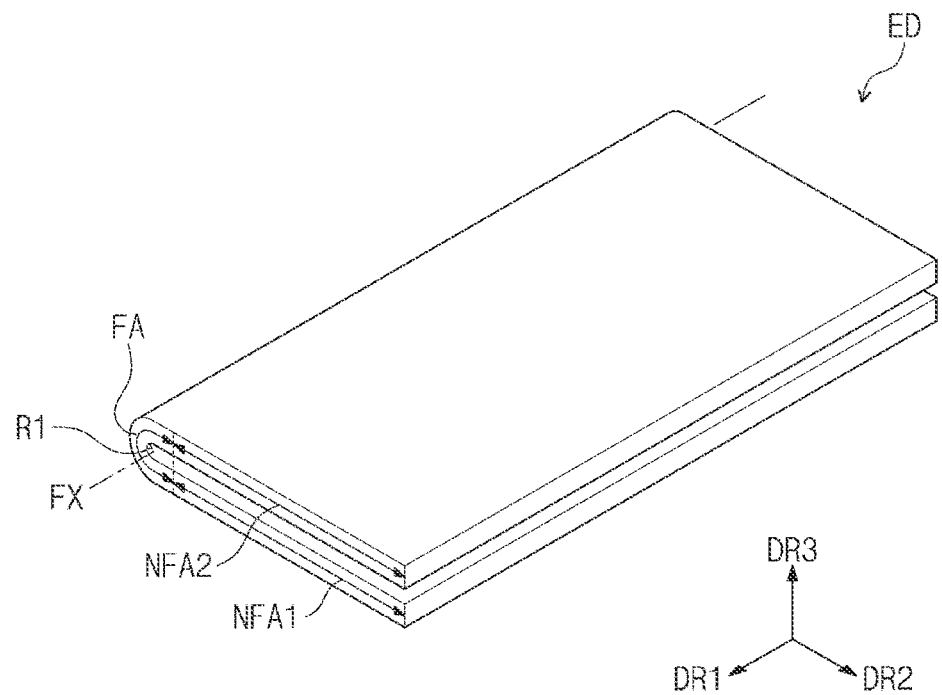
FIG. 1B is a schematic perspective view illustrating a folded state of an electronic device according to an embodiment.
Figure 1C:
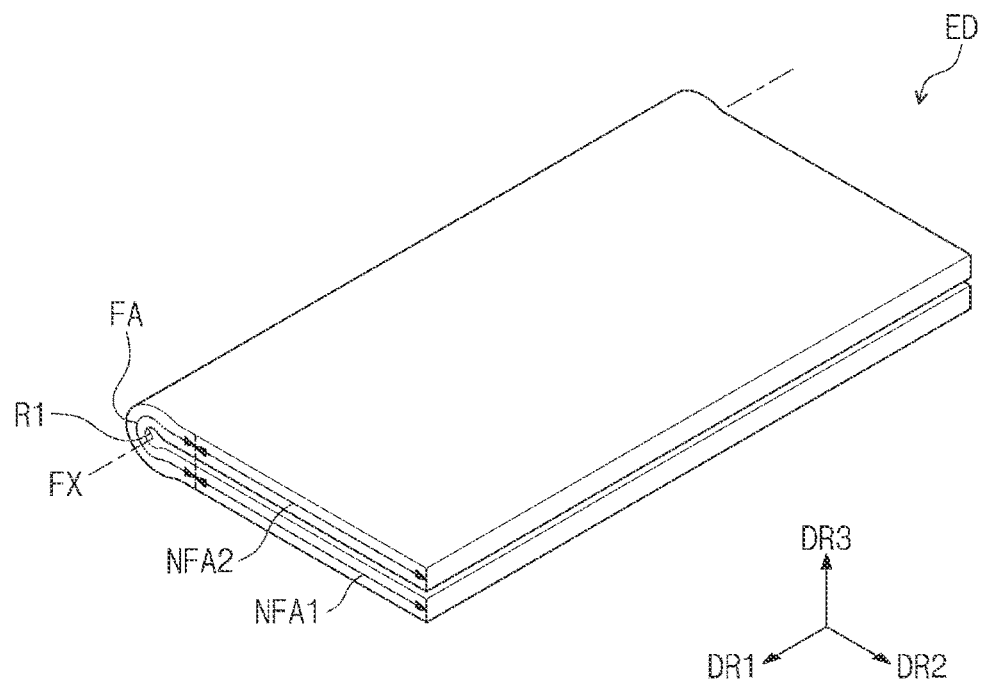
FIG. 1C is a schematic perspective view illustrating a folded state of an electronic device according to an embodiment.

FIGS. 1A to 1C are schematic perspective views of an electronic device ED according to an embodiment. FIG. 1A illustrates an unfolded state of the electronic device ED. As another example, FIGS. 1B and 1C illustrate a folded state of the electronic device ED.

Referring to FIGS. 1A to 1C, the electronic device ED according to an embodiment may include a display surface DS defined by a first direction DR1 and a second direction DR2 intersecting the first direction DR1. The electronic device ED may provide an image IM to a user through the display surface DS.

The display surface DS may include a display region DA and a non-display region NDA adjacent to the display region DA. The display region DA may display the image IM, and the non-display region NDA may not display the image IM. The non-display region NDA may surround the display region DA. However, an embodiment of the disclosure is not limited thereto, and the shape of the display region DA and the shape of the non-display region NDA may be changed.

The display surface DS may further include a sensing region TA. The sensing region TA may be a partial region of the display region DA. The sensing region TA has a higher light transmittance than the display region DA. An optical signal, such as visible light or infrared light, may move to the sensing region TA. The electronic device ED may include an electronic module that captures an external image through visible light passing through the sensing region TA or determines the accessibility of an external object through infrared light. Although FIG. 1A illustrates a sensing region TA as an example, an embodiment of the disclosure is not limited thereto, and multiple sensing regions TA may be provided.

The thickness direction of the electronic device ED may be parallel to a third direction DR3 that is a direction normal to a plane defined by a first direction DR1 and a second direction DR2. The directions indicated by the first to third directions DR1, DR2, and DR3 described in the specification are relative concepts and may be changed to other directions. The first to third directions are respectively indicated by the first to third directions DR1, DR2, and DR3, and are thus denoted by the same reference numerals. In this specification, the first direction DR1 and the second direction DR2 are orthogonal to each other, and the third direction DR3 may be a direction that is normal to a plane defined by the first direction DR1 and the second direction DR2.

The electronic device ED may include a folding region FA and non-folding regions NFA1 and NFA2. The non-folding regions NFA1 and NFA2 may include a first non-folding region NFA1 and a second non-folding region NFA2. In the second direction DR2, the folding region FA may be disposed between the first non-folding region NFA1 and the second non-folding region NFA2.

As illustrated in FIG. 1B, the folding region FA may be folded with reference to a folding axis FX parallel to the first direction DR1. The folding region FA has a predetermined curvature and a radius R1 of curvature. The first non-folding region NFA1 and the second non-folding region NFA2 may face each other, and the electronic device ED may be in-folded such that the display surface DS is not exposed to the outside.

The electronic device ED may be out-folded such that the display surface DS is exposed to the outside. In an embodiment, the electronic device ED may be configured such that an in-folding operation or an out-folding operation is repeated mutually from an unfolding operation, but an embodiment of the disclosure is not limited thereto. In an embodiment, the electronic device ED may be configured to select any of an unfolding operation, an in-folding operation, and an out-folding operation.

As illustrated in FIG. 1B, a distance between the first non-folding region NFA1 and the second non-folding region NFA2 may be substantially equal to the radius R1 of curvature. As another example, FIG. 1C illustrates that the distance between the first non-folding region NFA1 and the second non-folding region NFA2 is smaller than the radius R1 of curvature. FIGS. 1B and 1C are illustrated with reference to the display surface DS, and a case or housing EDC (see FIG. 2A) forming (or constituting) an exterior of the electronic device ED may contact end regions of the first non-folding region NFA1 and the second non-folding region NFA2.

Figure 2A:
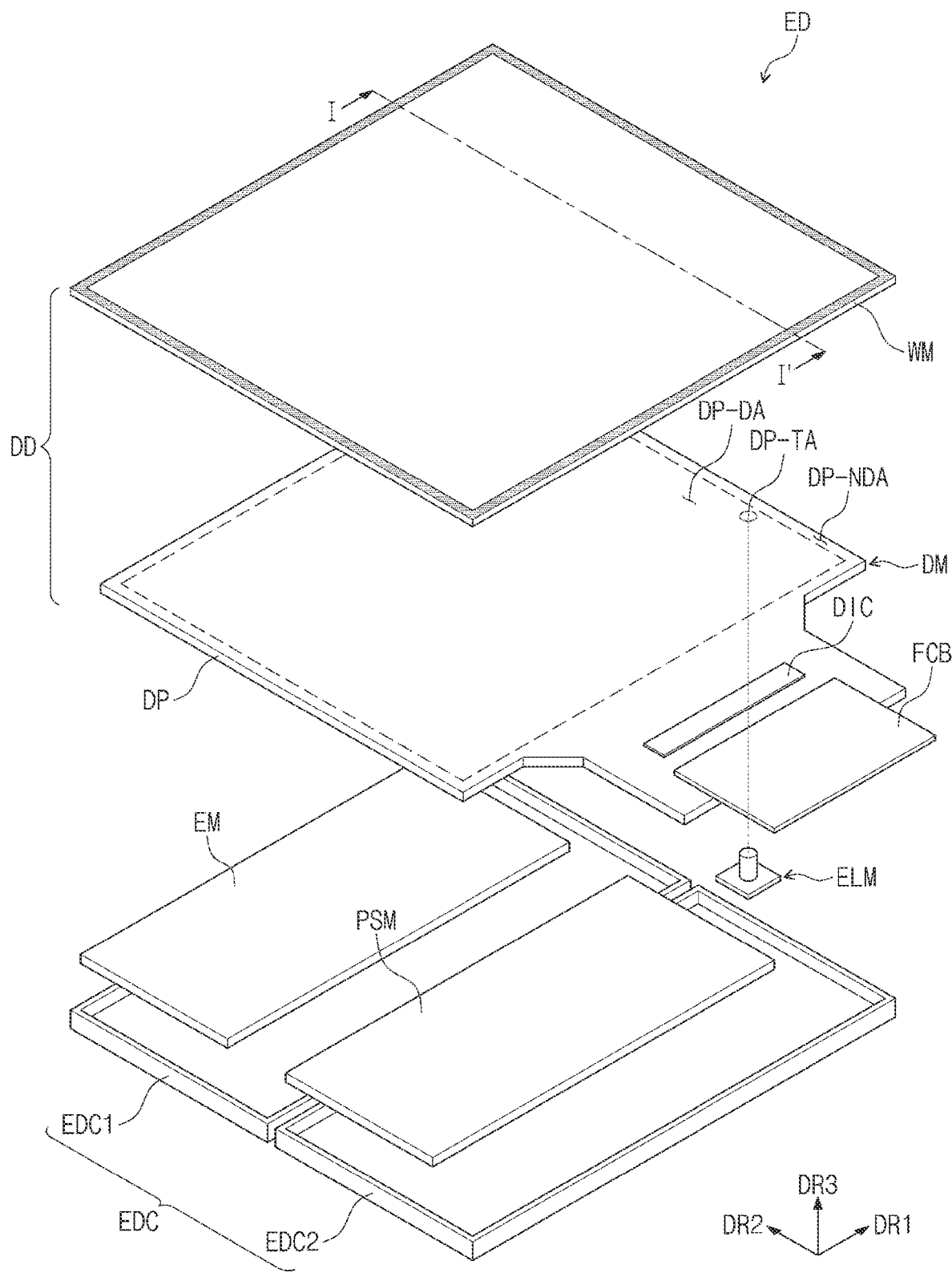
FIG. 2A is a schematic exploded perspective view illustrating an electronic device according to an embodiment.
Figure 2B:
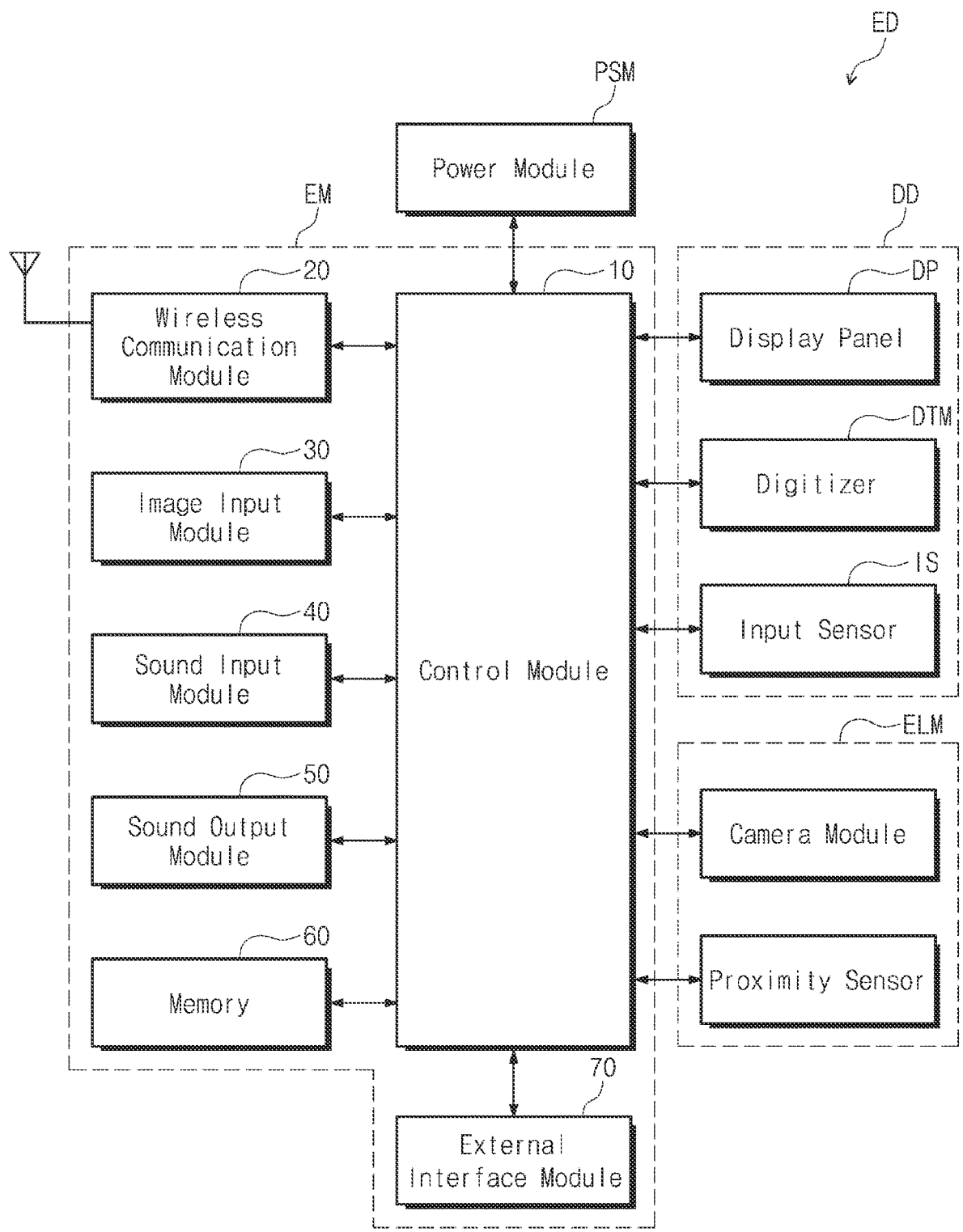
FIG. 2B is a schematic block diagram of an electronic device according to an embodiment.

FIG. 2A is a schematic exploded perspective view of an electronic device ED according to an embodiment. FIG. 2B is a schematic block diagram of an electronic device ED according to an embodiment.

Referring to FIGS. 2A and 2B, the electronic device ED may include a display device DD, an electronic module EM, an electro-optical module ELM, a power module PSM, and a housing EDC. Although not illustrated in the drawings, the electronic device ED may further include a mechanical structure for controlling the folding operation of the display device DD.

The display device DD may generate an image and sense an external input. The display device DD may include a window WM and a display module DM. The window WM may provide a front surface of the electronic device ED.

The display module DM may include at least a display panel DP. Although FIG. 2A illustrates only the display panel DP among the stacked structures of the display module DM, the display module DM may further include components disposed on the display panel DP. For example, the display panel DP may be a light emitting display panel such as an organic light emitting display panel or a quantum dot light emitting display panel. However, this is an example, and an embodiment is not limited thereto.

The display panel DP may include a display region DP-DA and a non-display region DP-NDA corresponding to the display region DA (see FIG. 1A) and the non-display region NDA (see FIG. 1A) of the electronic device ED. In this specification, a "region/part and a region/part correspond" means that the region/part and the region/part overlap each other in a given direction, and they are not limited to having a same area.

The display panel DP may include a sensing region DP-TA corresponding to the sensing region TA of FIG. 1A. The sensing region DP-TA may have a lower resolution than the display region DP-DA. The sensing region DP-TA will be described in more detail below.

As illustrated in FIG. 2A, a driving chip DIC may be disposed in the non-display region DP-NDA of the display panel DP. A flexible circuit film FCB may be bonded or attached to the non-display region DP-NDA of the display panel DP. Although not illustrated in the drawings, the flexible circuit film FCB may be electrically connected to a main circuit board.

The driving chip DIC may include driving elements, for example, a data driving circuit, for driving pixels of the display panel DP. Although FIG. 2A illustrates a structure in which the driving chip DIC is mounted on the display panel DP, an embodiment is not limited thereto. For example, the driving chip DIC may also be mounted on the flexible circuit film FCB.

As illustrated in FIG. 2B, the display device DD may include an input sensor IS and a digitizer DTM. The input sensor IS may detect a user input. A capacitive type input sensor IS may be disposed on the display panel DP. The digitizer DTM may sense the input of a stylus pen. An electromagnetic induction type digitizer DTM may be disposed under the display panel DP.

The electronic module EM includes a control module 10, a wireless communication module 20, an image input module 30, a sound input module 40, a sound output module 50, a memory 60, and an external interface module 70, etc. The modules may be mounted on the circuit board or electrically connected through a flexible circuit board. The electronic module EM is electrically connected to the power module PSM.

The control module 10 controls the overall operation of the electronic device ED. For example, the control module 10 activates or deactivates the display device DD in accordance with a user input. The control module 10 may control the image input module 30, the sound input module 40, the sound output module 50, etc., in accordance with a user input. The control module 10 may include at least one microprocessor.

The wireless communication module 20 may transmit and receive a wireless signal to and from another terminal for example by using a Bluetooth or Wi-Fi line. The wireless communication module 20 may transmit and receive a voice signal by using a general communication line. The wireless communication module 20 may include antenna modules.

The image input module 30 may process an image signal and convert the image signal into image data that can be displayed on the display device DD. The sound input module 40 may receive an external sound signal through a microphone in a recording mode, a voice recognition mode, etc., and convert the external sound signal into electrical voice data. The sound output module 50 may convert the sound data received from the wireless communication module 20 or the sound data stored in the memory 60, and output the converted sound data to the outside.

The external interface module 70 may serve as an interface electrically connected to an external charger, a wired/wireless data port, a card socket (for example, a memory card or a SIM/UIM (subscriber identification module/user identity module) card), etc. The power module PSM may supply power required for the overall operation of the electronic device ED. The power module PSM may include a typical battery device.

The electro-optical module ELM may be an electronic component that outputs or receives an optical signal. The electro-optical module ELM may include a camera module and/or a proximity sensor. The camera module may take an external image through the sensing region DP-TA.

The housing EDC illustrated in FIG. 2A may be bonded to the display device DD, in particular, to the window WM to accommodate other modules described above. Although the housing EDC is illustrated as including two portions EDC1 and EDC2 separated from each other, the disclosure is not limited thereto. Although not illustrated in the drawings, the electronic device ED may further include a hinge structure for connecting the two portions EDC1 and EDC2.

Figure 3A:
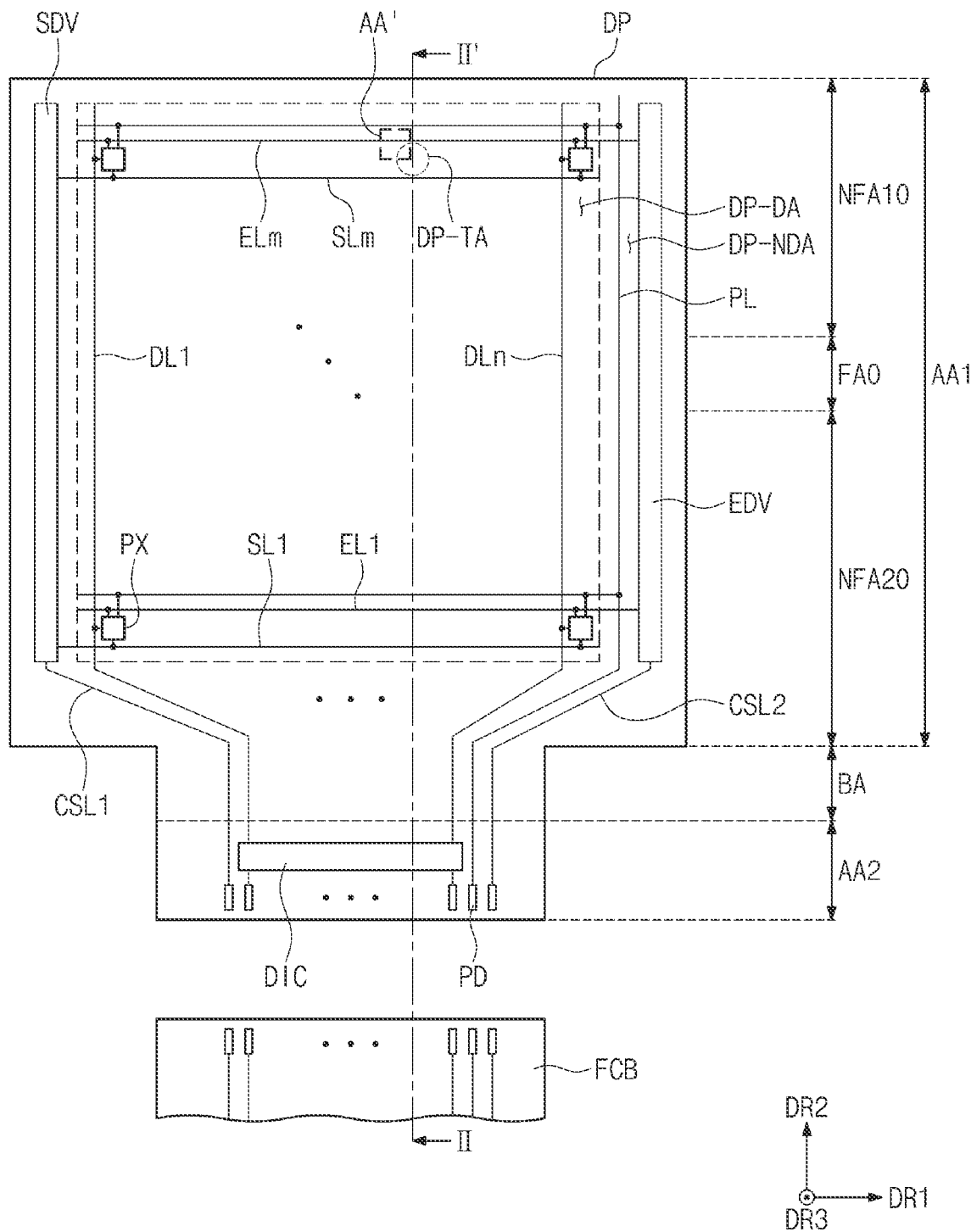
FIG. 3A is a schematic plan view of a display panel according to an embodiment.
Figure 3B:
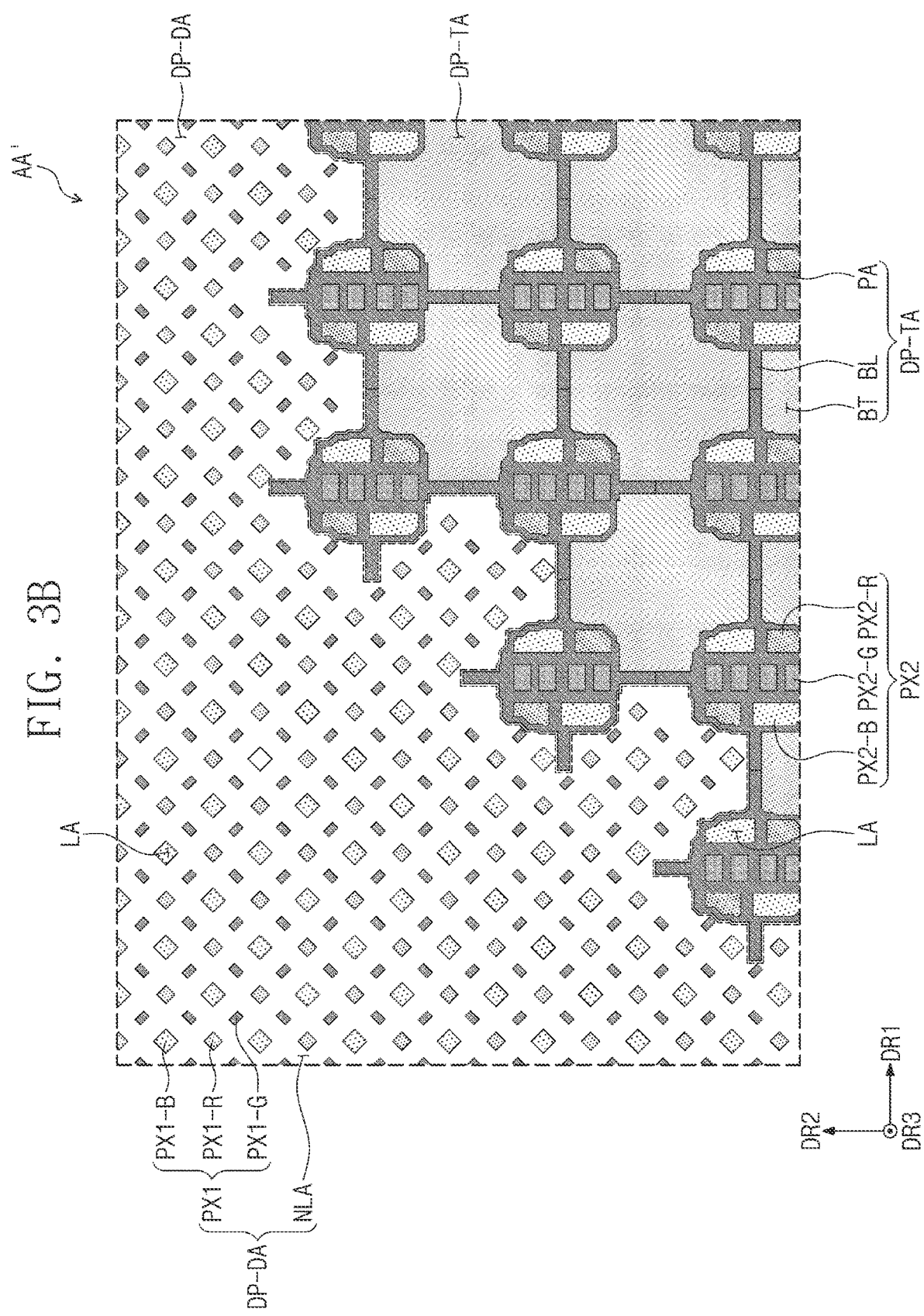
FIG. 3B is a schematic cross-sectional view illustrating a portion corresponding to region AA' of FIG. 3A.

FIG. 3A is a schematic plan view of a display panel DP according to an embodiment. FIG. 3B is a schematic enlarged plan view of region AA' of FIG. 3A.

Referring to FIG. 3A, the display panel DP may include a display region DP-DA and a non-display region DP-NDA adjacent to the display region DP-DA. The display region DP-DA and the non-display region DP-NDA are distinguished by the presence or absence of the arrangement of a pixel PX. The pixel PX may be disposed in the display region DP-DA. A scan driver SDV, a data driver, and a light emitting driver EDV may be disposed in the non-display region DP-NDA. The data driver may be a partial circuit configured by the driving chip DIC illustrated in FIG. 3A.

The display panel DP includes a first region AA1, a second region AA2, and a bending region BA which are distinguished in the second direction DR2. The second region AA2 and the bending region BA may be partial regions of the non-display region DP-NDA. The bending region BA may be disposed between the first region AA1 and the second region AA2.

The first region AA1 corresponds to the display surface DS of FIG. 1A. The first region AA1 may include a first non-folding region NFA10, a second non-folding region NFA20, and a folding region FA0. The first non-folding region NFA10, the second non-folding region NFA20, and the folding region FA0 respectively correspond to the first non-folding region NFA1, the second non-folding region NFA2, and the folding region FA of FIGS. 1A to 1C.

Lengths of the bending region BA and the second region AA2 in the first direction DR1 may be smaller than the length of the first region AA1. A region having a short length in a bending axis direction may be readily bent.

The display panel DP may include pixels PX, scan lines SL1 to SLm, data lines DL1 to DLn, light emitting lines EL1 to ELm, first and second control lines CSL1 and CSL2, a power line PL, and pads PD, where m and n are natural numbers. The pixels PX may be electrically connected to the scan lines SL1 to SLm, the data lines DL1 to DLn, and the light emitting lines EL1 to ELm.

The scan lines SL1 to SLm may extend in the first direction DR1 and be electrically connected to the scan driver SDV. The data lines DL1 to DLn may extend in the second direction DR2 and be electrically connected to the driving chip DIC via the bending region BA. The light emitting lines EL1 to ELm may extend in the first direction DR1 and be electrically connected to the light emitting driver EDV.

The power line PL may include a portion extending in the second direction DR2 and a portion extending in the first direction DR1. The portion extending in the first direction DR1 and the portion extending in the second direction DR2 may be disposed on different layers. The portion of the power line PL extending in the second direction DR2 may extend to the second region AA2 via the bending region BA. The power line PL may provide a first voltage to the pixels PX.

The first control line CSL1 may be electrically connected to the scan driver SDV and extend toward a lower end of the second region AA2 via the bending region BA. The second control line CSL2 may be electrically connected to the light emitting driver EDV and extend toward a lower end of the second region AA2 via the bending region BA.

When viewed on a plane defined by the first direction DR1 and the second direction DR2, the pads PD may be disposed adjacent to the lower end of the second region AA2. The driving chip DIC, the power line PL, the first control line CSL1, and the second control line CSL2 may be electrically connected to the pads PD. The flexible circuit film FCB may be electrically connected to the pads PD through an anisotropic conductive adhesive layer.

As illustrated in FIG. 3B, the sensing region DP-TA may have a higher light transmittance and lower resolution than the display region DP-DA. Light transmittance and resolution are measured within a reference area.

The sensing region DP-TA may have a smaller occupancy ratio of a light blocking structure in the reference area than the display region DP-DA. The light blocking structure may include a conductive pattern of a circuit layer which will be described below, an electrode of a light emitting element, a light blocking pattern, etc.

The sensing region DP-TA may have a lower resolution in the reference area than the display region DP-DA. In the sensing region DP-TA, a smaller number of pixels may be disposed in the reference area (or a same area) than the display region DP-DA.

As illustrated in FIG. 3B, a first pixel PX1 may be disposed in the display region DP-DA, and a second pixel PX2 may be disposed in the sensing region DP-TA. The first pixel PX1 and the second pixel PX2 may have different light emitting areas, and the first pixel PX1 and the second pixel PX2 may have arrangements different from each other.

In FIG. 3B, the light emitting regions LA of the first pixel PX1 and the second pixel PX2 are illustrated as examples of the first pixel PX1 and the second pixel PX2. Each of the light emitting regions LA may be defined as a region in which a first electrode of the light emitting element is exposed from a pixel defining layer.

The first pixel PX1 may include a first color pixel PX1-R, a second color pixel PX1-G, and a third color pixel PX1-B, and the second pixel PX2 may include a first color pixel PX2-R, a second color pixel PX2-G, and a third color pixel PX2-B. Each of the first pixel PX1 and the second pixel PX2 may include a red pixel, a green pixel, and a blue pixel. A non-light emitting region NLA may be disposed between the light emitting regions LA in the display region DP-DA.

The sensing region DP-TA may include a pixel region PA, a wiring region BL, and a transmission region BT. The second pixel PX2 is disposed in the pixel region PA. Although it is illustrated that two first color pixels PX2-R, four second color pixels PX2-G, and two third color pixels PX2-B are disposed in a pixel region PA, an embodiment is not limited thereto.

A conductive pattern, a signal line, or a light blocking pattern related to the second pixel PX2 may be disposed in the pixel region PA and the wiring region BL. The light blocking pattern may be a metal pattern and may substantially overlap the pixel region PA and the wiring region BL.

Since the second pixel PX2 is not disposed in the transmission region BT of the sensing region DP-TA, the light transmittance of the sensing region DP-TA is increased. The transmission region BT may be a region through which an optical signal substantially passes.

Figure 4:
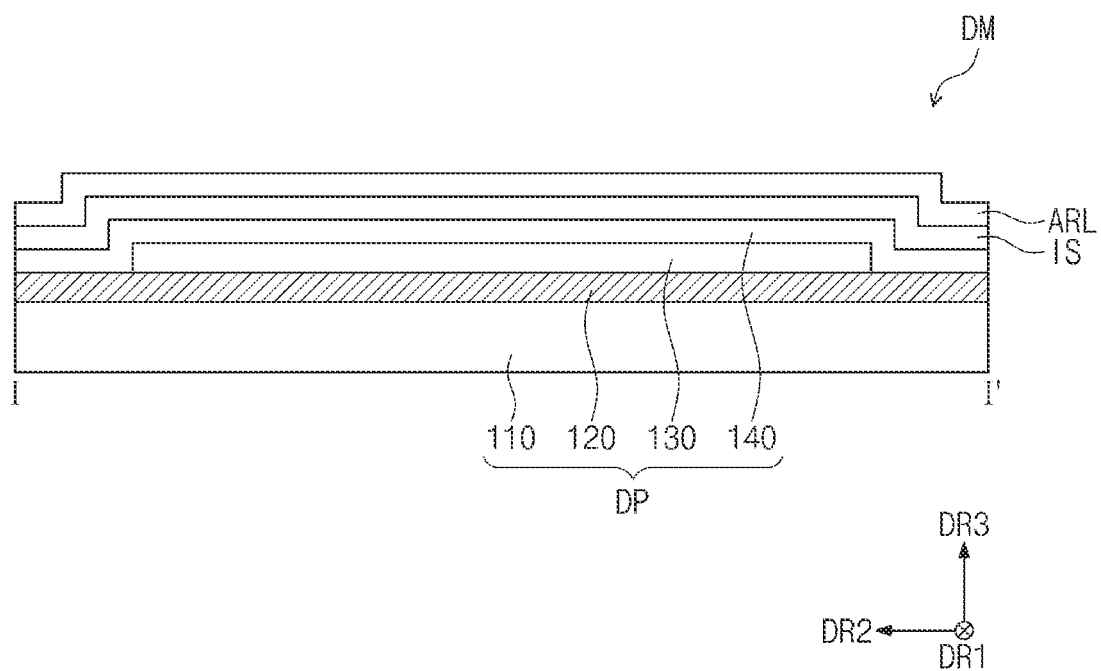
FIG. 4 is a schematic cross-sectional view illustrating a portion of an electronic device according to an embodiment.

FIG. 4 illustrates a portion corresponding to line I-I' of FIG. 2A and illustrates a schematic cross-sectional view of the display module DM. Referring to FIG. 4, the display module DM may include a display panel DP, an input sensor IS, and an anti-reflection layer ARL. The display panel DP may include a base layer 110, a circuit layer 120, a light emitting element layer 130, and an encapsulation layer 140.

The base layer 110 may be a member that provides a base surface on which the circuit layer 120 is disposed. The base layer 110 may be a flexible substrate that is bendable, foldable, rollable, etc. The base layer 110 may be a glass substrate, a metal substrate, or a polymer substrate. However, an embodiment is not limited thereto, and the base layer 110 may be an inorganic layer, an organic layer, or a composite material layer.

The base layer 110 may have a multilayer structure. For example, the base layer 110 may include a first synthetic resin layer, a multi- or single-layered inorganic layer, and a second synthetic resin layer disposed on the multi- or single-layered inorganic layer. Each of the first synthetic resin layer and the second synthetic resin layer may include, but is not particularly limited to, a polyimide-based resin.

The circuit layer 120 may be disposed on the base layer 110. The circuit layer 120 may include an insulating layer, a semiconductor pattern, a conductive pattern, and a signal line.

The light emitting element layer 130 may be disposed on the circuit layer 120. The light emitting element layer 130 may include a light emitting element. For example, the light emitting element may include an organic light emitting material, an inorganic light emitting material, an organic-inorganic light emitting material, a quantum dot, a quantum rod, a micro LED, or a nano LED.

The encapsulation layer 140 may be disposed on the light emitting element layer 130. The encapsulation layer 140 may protect the light emitting element layer 130 from foreign substances such as moisture, oxygen, and dust particles. The encapsulation layer 140 may include at least one inorganic layer. The encapsulation layer 140 may include a laminate structure of an inorganic layer/organic layer/inorganic layer.

The input sensor IS may be directly disposed on the display panel DP. The display panel DP and the input sensor IS may be formed by a continuous process. Here, "directly disposed" may mean that a third component is not disposed between the input sensor IS and the display panel DP. For example, a separate adhesive member may not be disposed between the input sensor IS and the display panel DP.

The anti-reflection layer ARL may be directly disposed on the input sensor IS. The anti-reflection layer ARL may reduce reflectance of external light incident from the outside of the display device DD. The anti-reflection layer ARL may include color filters. The color filters may have a predetermined arrangement. For example, the color filters may be arranged in consideration of light emitting colors of pixels included in the display panel DP. The anti-reflection layer ARL may further include a black matrix adjacent to the color filters.

In an embodiment, positions of the input sensor IS and the anti-reflection layer ARL may be interchanged. The anti-reflection layer ARL may be replaced with a polarizing film. The polarizing film may be bonded to the input sensor IS by an adhesive layer.

Figure 5A:
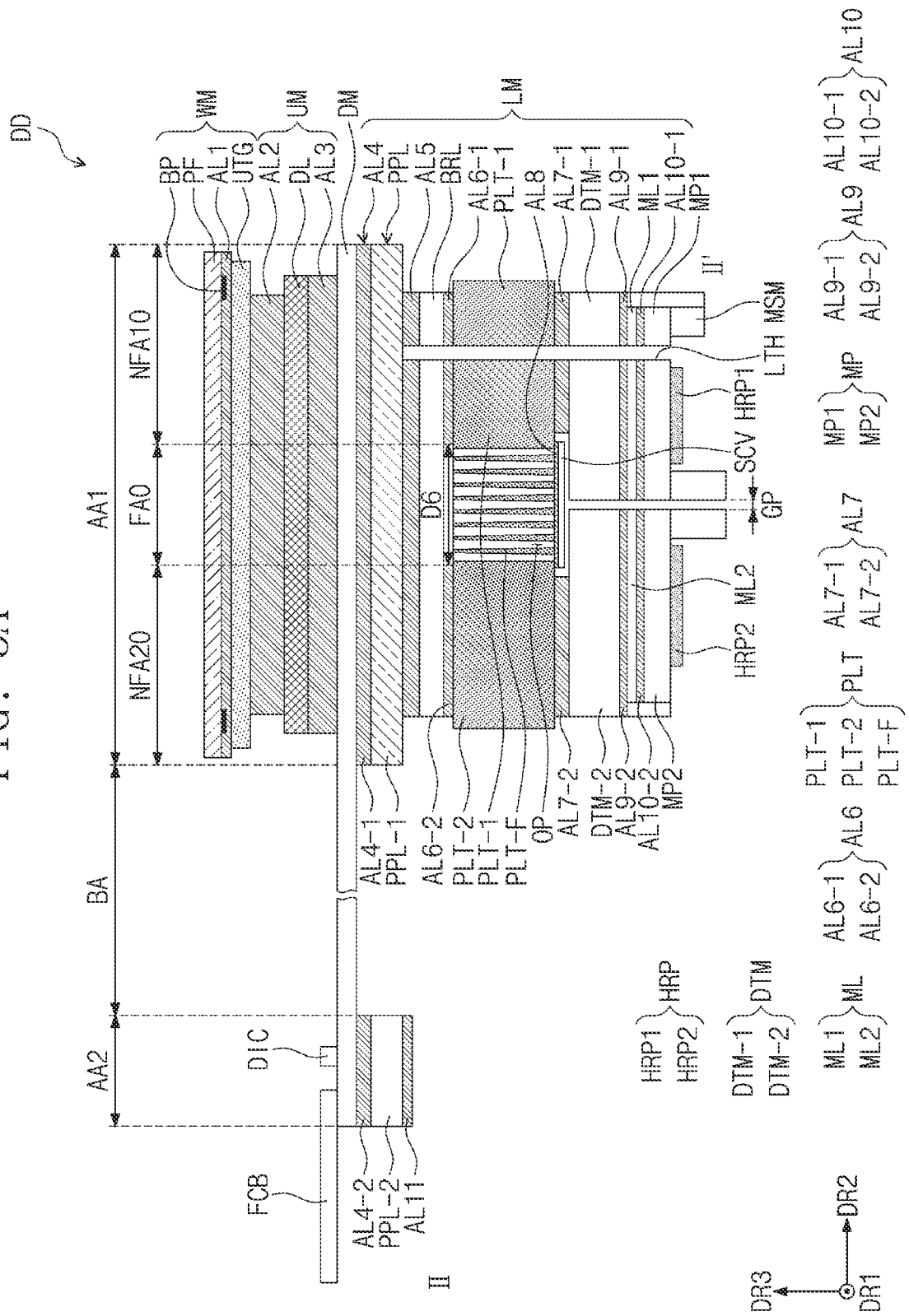
FIG. 5A is a schematic cross-sectional view illustrating an electronic device according to an embodiment.
Figure 5B:
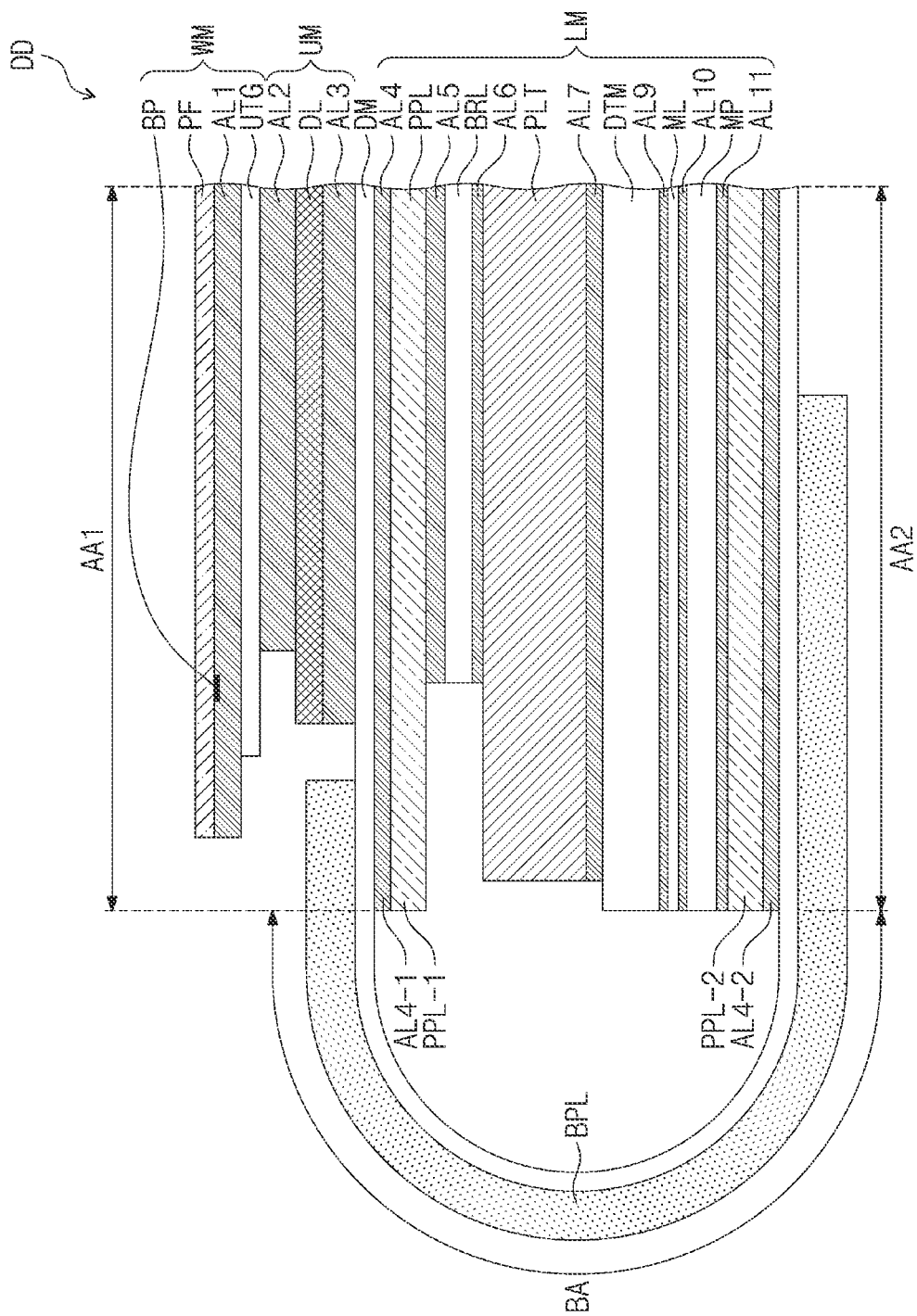
FIG. 5B is a schematic cross-sectional view illustrating an electronic device according to an embodiment.

FIGS. 5A and 5B are schematic cross-sectional views of a display device DD according to an embodiment. FIG. 5A illustrates a state in which the display module DM is unfolded without being bent. FIG. 5B illustrates a state in which the bending region BA (see FIG. 3A) of the display module DM is bent. In FIGS. 5A and 5B, regions dividing the display module DM are illustrated with reference to the display panel DP of FIG. 3A.

Referring to FIGS. 5A and 5B, the display device DD may include a window WM, an upper member UM, a display module DM, and a lower member LM. The upper member UM refers to a component disposed between the window WM and the display module DM, and the lower member LM refers to a component disposed under the display module DM.

The window WM may include a thin glass substrate UTG, a window protective layer PF disposed on the thin glass substrate UTG, and a bezel pattern BP disposed on a lower surface of the window protective layer PF. The window protective layer PF may include a synthetic resin film. The window WM may include an adhesive layer AL1 (hereinafter referred to as a first adhesive layer) bonding the window protective layer PF and the thin glass substrate UTG.

The bezel pattern BP may overlap the non-display region NDA illustrated in FIG. 1A. The bezel pattern BP may be disposed on a surface of the thin glass substrate UTG or a surface of the window protective layer PF. Although FIGS. 5A and 5B illustrate the bezel pattern BP disposed on the lower surface of the window protective layer PF as an example, an embodiment is not limited thereto. The bezel pattern BP may be disposed on the upper surface of the window protective layer PF. The bezel pattern BP may be a colored light blocking layer, and may be formed, for example, by means of a coating method. The bezel pattern BP may include a base material and a dye or pigment mixed with the base material.

The thickness of the thin glass substrate UTG may be in a range of about 15 um to about 45 um. The thin glass substrate UTG may be chemically strengthened glass. In the thin glass substrate UTG, the generation of wrinkles may be minimized even in case that the thin glass substrate UTG is repeatedly folded and unfolded.

The thickness of the window protective layer PF may be in a range of about 50 um to about 80 um. The window protective layer PF may include polyimide, polycarbonate, polyamide, triacetylcellulose, polymethylmethacrylate, or polyethylene terephthalate. Although not illustrated in the drawings, at least one of a hard coating layer, an anti-fingerprint layer, or an anti-reflection layer may be disposed on the upper surface of the window protective layer PF.

The first adhesive layer AL1 may be a pressure sensitive adhesive film (PSA) or an optically clear adhesive (OCA). The adhesive layers described below and first adhesive layer AL1 may include a same adhesive.

The first adhesive layer AL1 may be separated from the thin glass substrate UTG. Since the strength of the window protective layer PF is lower than the strength of the thin glass substrate UTG, a scratch may occur relatively readily in the window protective layer PF. In case that a scratch occurs, the window protective layer PF may be replaced. After the first adhesive layer AL1 and the window protective layer PF are separated from the thin glass substrate UTG, a new window protective layer may be attached to the thin glass substrate UTG.

In a plan view, the edge of the thin glass substrate UTG may not overlap the bezel pattern BP. As the edge of the thin glass substrate UTG does not overlap the bezel pattern BP, the edge of the thin glass substrate UTG may be exposed from the bezel pattern BP. Accordingly, fine cracks generated on the edge of the thin glass substrate UTG may be inspected by means of an inspection device.

The upper member UM may include an upper film DL. The upper film DL may include a synthetic resin film. The upper film DL may absorb an external impact applied to the front surface of the display device DD. The display module DM described with reference to FIG. 4 may include an anti-reflection layer ARL replacing the polarizing film, and an impact strength thus reduced may be compensated by the upper film DL. However, an embodiment of the disclosure is not limited thereto, and the upper film DL may be omitted.

The upper member UM may include a second adhesive layer AL2 bonding the upper film DL and the window WM, and a third adhesive layer AL3 bonding the upper film DL and the display module DM.

The lower member LM may include a panel protective layer PPL, a barrier layer BRL, a support layer PLT, a cover layer SCV, a digitizer DTM, a metal layer ML, a metal plate MP, and a heat dissipation layer HRP, and fourth to eleventh adhesive layers AL4 to AL11. Each of the fourth to eleventh adhesive layers AL4 to AL11 may include an adhesive such as a pressure sensitive adhesive or an optically clear adhesive. In an embodiment, some of the abovementioned components may be omitted. For example, the metal plate MP or the heat dissipation layer HRP and the adhesive layer thereof may be omitted.

The panel protective layer PPL may be disposed under the display module DM. The panel protective layer PPL may protect the lower portion of the display module DM. The panel protective layer PPL may include a flexible plastic material. For example, the panel protective layer PPL may include polyethylene terephthalate.

In an embodiment of the disclosure, the panel protective layer PPL may not be disposed in the folding region FA. The panel protective layer PPL may include a first panel protective layer PPL-1 protecting the first region AA1 and a second panel protective layer PPL-2 protecting the second region AA2 of the display panel DP (see FIG. 3A).

The fourth adhesive layer AL4 may adhere or attach the panel protective layer PPL and the display panel DP. The fourth adhesive layer AL4 may include a first portion AL4-1 corresponding to the first panel protective layer PPL-1, and a second portion AL4-2 corresponding to the second panel protective layer PPL-2.

As illustrated in FIG. 5B, in case that the bending region BA is bent, the second panel protective layer PPL-2 may be disposed under the first region AA1 and the first panel protective layer PPL-1 together with the second region AA2.

Since the panel protective layer PPL is not disposed in the bending region BA, the bending region BA may be more readily bent. The second panel protective layer PPL-2 may be attached to the metal plate MP by the eleventh adhesive layer AL11.

Referring to FIG. 5B, the bending region BA may have a predetermined curvature and a radius of curvature. The radius of curvature may be about 0.1 mm to about 0.5 mm. A bending protective layer BPL may be disposed at least in the bending region BA. The bending protective layer BPL may overlap the bending region BA, the first region AA1, and the second region AA2. The bending protective layer BPL may be disposed on a portion of the first region AA1 and a portion of the second region AA2.

The bending protective layer BPL may be bent together with the bending region BA. The bending protective layer BPL may protect the bending region BA from an external impact and may control a neutral surface of the bending region BA. The bending protective layer BPL controls the stress of the bending region BA such that the neutral surface is closer to the signal lines disposed in the bending region BA.

As illustrated in FIGS. 5A and 5B, the fifth adhesive layer AL5 may bond the panel protective layer PPL and the barrier layer BRL. The barrier layer BRL may be disposed under the panel protective layer PPL. The barrier layer BRL may increase resistance to a compressive force caused due to external pressure. Accordingly, the barrier layer BRL may serve to prevent deformation of the display panel DP. The barrier layer BRL may include a flexible plastic material such as polyimide or polyethylene terephthalate. The barrier layer BRL may be a colored film having low light transmittance. The barrier layer BRL may absorb light incident from the outside. For example, the barrier layer BRL may be a black synthetic resin film. When the display device DD is viewed from the upper side of the window protective layer PF, components disposed under the barrier layer BRL may not be visually recognized by a user.

The sixth adhesive layer AL6 may bond the barrier layer BRL and the support layer PLT. The sixth adhesive layer AL6 may include a first portion AL6-1 and a second portion AL6-2 spaced apart from each other. A distance D6 (or an interval) between the first portion AL6-1 and the second portion AL6-2 may correspond to a width of the folding region FA0 and may be greater than a gap GP which will be described below. The distance D6 between the first portion AL6-1 and the second portion AL6-2 may be in a range of about 7 mm to about 15 mm, for example about 9 mm to about 13 mm.

Although the first portion AL6-1 and the second portion AL6-2 are defined as different portions included by an adhesive layer, an embodiment of the disclosure is not limited thereto. The first portion AL6-1 may be defined as an adhesive layer (for example, a first adhesive layer), and the second portion AL6-2 may be defined as another adhesive layer (for example, a second adhesive layer). The same description may be applied not only to the sixth adhesive layer AL6 but also to adhesive layers including two portions of adhesive layers to be described below.

The support layer PLT may be disposed under the barrier layer BRL. The support layer PLT may support components disposed on the support layer PLT and may maintain an unfolded state and a folded state of the display device DD. The support layer PLT may transmit a magnetic field generated by a digitizer DTM which will be describe below, without loss or with minimal loss.

The support layer PLT may include a first support portion PLT-1 corresponding to the first non-folding region NFA10, a second support portion PLT-2 corresponding to the second non-folding region NFA20, and a folding portion PLT-F corresponding to the folding region FA0. The folding portion PLT-F may be disposed between the first support portion PLT-1 and the second support portion PLT-2. An opening OP may be defined in the folding portion PLT-F.

During the folding operation illustrated in FIGS. 1B and 1C, the folding portion PLT-F of the support layer PLT may prevent foreign substances from penetrating into a region of the barrier layer BRL opened from the first support portion PLT-1 and the second support portion PLT-2. The flexibility of the support layer PLT may be improved by the openings OP. As the sixth adhesive layer AL6 is not disposed in a region corresponding to the folding region FA0, the flexibility of the support layer PLT may be improved. The support layer PLT will be described in more detail below.

The seventh adhesive layer AL7 bonds the support layer PLT and the digitizer DTM, the eighth adhesive layer AL8 may bond the cover layer SCV and the support layer PLT. The seventh adhesive layer AL7 may include a first portion AL7-1 bonding the first support portion PLT-1 and a first digitizer DTM-1, and a second portion AL7-2 bonding the second support portion PLT-2 and a second digitizer DTM-2.

The cover layer SCV may be disposed between the first portion AL7-1 of the seventh adhesive layer AL7 and the second portion AL7-2 of the seventh adhesive layer AL7 in the second direction DR2. The cover layer SCV may be spaced apart from the digitizer DTM to prevent interference with the digitizer DTM in the unfolded state. The sum of the thicknesses of the cover layer SCV and the eighth adhesive layer AL8 may be smaller than the thickness of the seventh adhesive layer AL7.

The cover layer SCV may be disposed on a surface of the support layer PLT to cover the opening OP of the folding portion PLT-F. The cover layer SCV may not overlap the first support portion PLT-1 and the second support portion PLT-2 of the support layer PLT. The cover layer SCV may have a lower elastic modulus than the support layer PLT. For example, the cover layer SCV may include a thermoplastic polyurethane, a rubber, a silicone, etc., but an embodiment is not limited thereto.

The digitizer DTM is also referred to as an EMR (electromagnetic resonance) sensing panel and includes a number of loop coils that generate a magnetic field of a predetermined resonant frequency with an electronic pen. A magnetic field formed in the loop coils is applied to an LC resonance circuit composed of an inductor (coil) and a capacitor of an electronic pen. The coils generate a current by means of the received magnetic field and transfers the generated current to the capacitor. The capacitor is charged with the current input from the coils and discharges the charged current to the coils. As a result, a magnetic field of a resonant frequency is emitted to the coils. The magnetic field emitted by the electronic pen may be absorbed again by the loop coils of the digitizer, and accordingly, it is possible to determine at which position the electronic pen is adjacent to a touch screen.

The first digitizer DTM-1 and the second digitizer DTM-2 may be disposed to be spaced apart from each other with a predetermined gap GP. On a cross section defined by the second direction DR2 and the third direction DR3, the length of the gap GP parallel to the second direction DR2 may be in a range of about 0.3 mm to about 3 mm and may be disposed to correspond to the folding region FA0.

The metal layer ML may be disposed under the digitizer DTM. The metal layer ML may include a first metal layer ML1 and a second metal layer ML2 overlapping a first support portion PLT-1 of the support layer PLT and a second support portion PLT-2 of the support layer PLT, respectively. The metal layer ML may emit heat generated in case that the digitizer DTM is driven, to the outside. The metal layer ML may transfer heat generated by the digitizer DTM to the lower side. The metal layer ML may have greater electrical and thermal conductivity than the metal plate MP, which will be described below. For example, the metal layer ML may include copper or aluminum.

The ninth adhesive layer AL9 may bond the digitizer DTM and the metal layer ML. The ninth adhesive layer AL9 may include a first portion AL9-1 and a second portion AL9-2 respectively corresponding to the first metal layer ML1 and the second metal layer ML2.

The metal plate MP may be disposed under the metal layer ML. The metal plate MP may include a first metal plate MP1 and a second metal plate MP2 overlapping the first metal layer ML1 and the second metal layer ML2, respectively. The metal plate MP may absorb an external impact applied from the lower side.

The metal plate MP may have greater strength than the metal layer ML and may have a greater thickness. The metal plate MP may include a metal material such as stainless steel. For example, the metal plate MP may include SUS 304.

The tenth adhesive layer AL10 may bond the metal layer ML and the metal plate MP. The tenth adhesive layer AL10 may include a first portion AL10-1 and a second portion AL10-2 respectively corresponding to the first metal plate MP1 and the second metal plate MP2.

The heat dissipation layer HRP may be disposed under the metal plate MP. The heat dissipation layer HRP may include a first heat dissipation layer HRP1 and a second heat dissipation layer HRP2 respectively overlapping the first metal plate MP1 and the second metal plate MP2. The heat dissipation layer HRP may dissipate heat generated by electronic components (not shown) disposed under the heat dissipation layer HRP. The electronic components may be the electronic module EM illustrated in FIGS. 2A and 2B. The heat dissipation layer HRP may have a structure in which an adhesive layer and a graphite layer are alternately stacked. The outermost adhesive layer may be attached to the metal plate MP.

A magnetic field shielding sheet MSM may be disposed under the metal plate MP. The magnetic field shielding sheet MSM may shield a magnetic field generated from a magnetic material (not shown) disposed under the metal plate MP. The magnetic field shielding sheet MSM may prevent the magnetic field generated from the magnetic material from interfering with the digitizer DTM.

The magnetic field shielding sheet MSM may include multiple portions. The portions may have different thicknesses. Multiple portions may be disposed to match a step difference (or height or thickness difference) of a bracket (not shown) disposed under the display device DD. The magnetic field shielding sheet MSM may have a structure in which magnetic field shielding layers and adhesive layers are alternately stacked. A portion of the magnetic field shielding sheet MSM may be directly attached to the metal plate MP, and a portion of the magnetic field shielding sheet MSM may be directly attached to the metal plate MP.

A through hole LTH may be formed in some of members included in the lower member LM. The through hole LTH may be formed to overlap the sensing region DP-TA of FIG. 2A. As illustrated in FIG. 5A, the through hole LTH may penetrate from the adhesive layer AL5 to the metal plate MP. The through hole LTH is formed by removing the light blocking structure from the path of the optical signal, and the through hole LTH may improve the optical signal reception efficiency of the electro-optical module ELM.

Figure 6A:
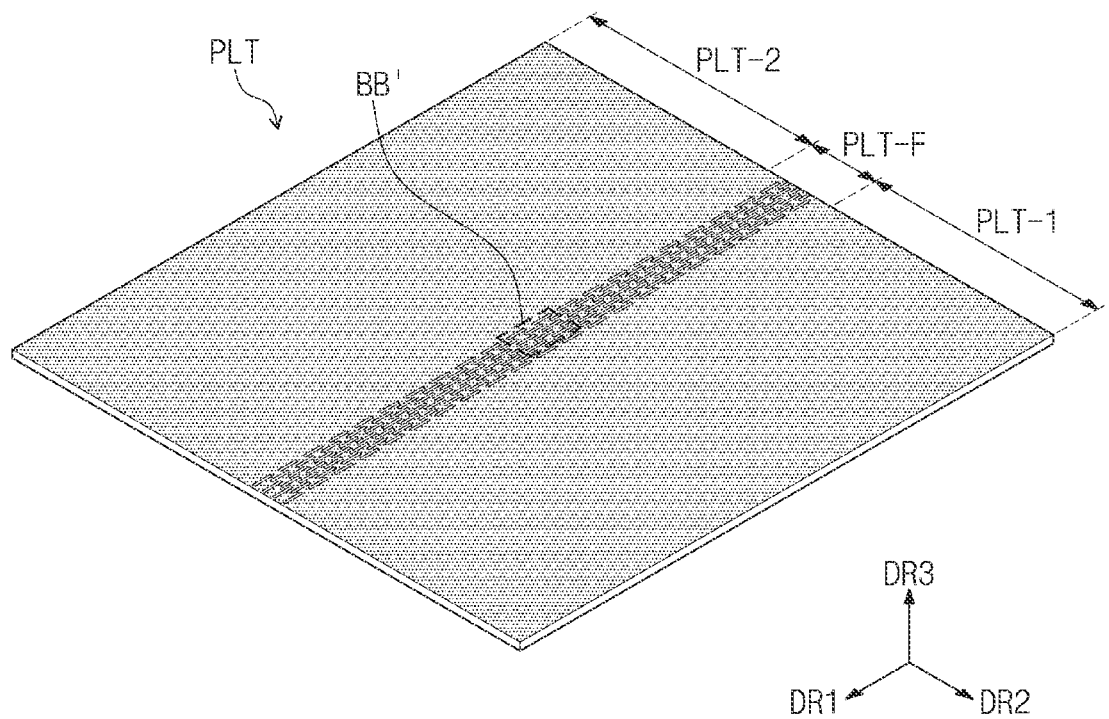
FIG. 6A is a schematic perspective view illustrating a portion of an electronic device according to an embodiment.
Figure 6B:
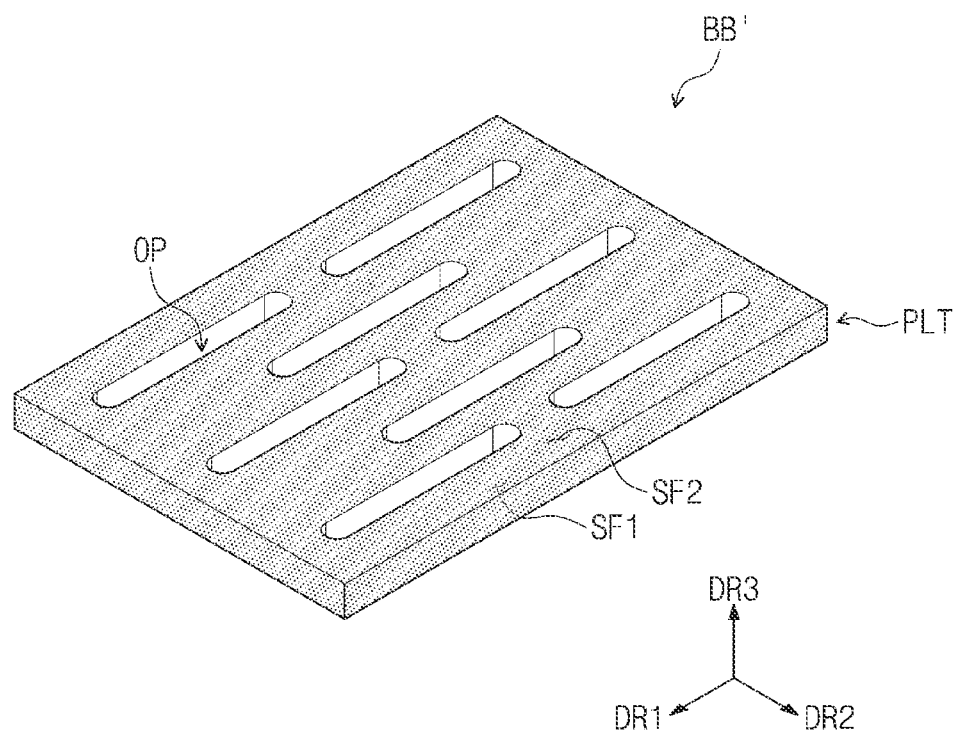
FIG. 6B is a schematic perspective view illustrating a portion corresponding to region BB' of FIG. 6A.

FIG. 6A is a schematic perspective view illustrating a support layer PLT according to an embodiment. FIG. 6B is a schematic perspective view illustrating a region corresponding to region BB' of FIG. 6A. Referring to FIG. 6A, the opening OP may be formed in the folding portion PLT-F of the support layer PLT. FIG. 6B is a schematic enlarged view of the folding portion PLT-F of the support layer PLT.

Although FIG. 6A illustrates that the support layer PLT has a single-layer structure, an embodiment is not limited thereto. In an embodiment, the support layer PLT may include a multilayer structure in which layers are stacked.

The support layer PLT may include one surface SF1 and another surface SF2 facing each other. Each of the one surface SF1 and the other surface (or another surface) SF2 may be parallel to a plane defined by the first direction DR1 and the second direction DR2. As illustrated in FIG. 6B, one surface SF1 of the support layer PLT may be a lower surface of the support layer PLT, and the other surface SF2 of the support layer PLT may be an upper surface of the support layer PLT. The upper surface of the support layer PLT may be adjacent to the barrier layer BRL, and the lower surface of the support layer PLT may be adjacent to the digitizer DTM. Unlike those illustrated in FIG. 6B, one surface SF1 of the support layer PLT may be an upper surface of the support layer PLT, and the other surface SF2 of the support layer PLT may be a lower surface of the support layer PLT.

The opening OP may have a trapezoidal shape on a cross section defined by the second direction DR2 and the third direction DR3. In a cross-sectional view, the opening OP may have a trapezoidal shape including a short side and a long side parallel to each other. The short side and the long side of the trapezoidal shape may be parallel to the second direction DR2. The shape of the opening OP will be described in more detail below with reference to FIGS. 12A and 12B.

Figure 6C:
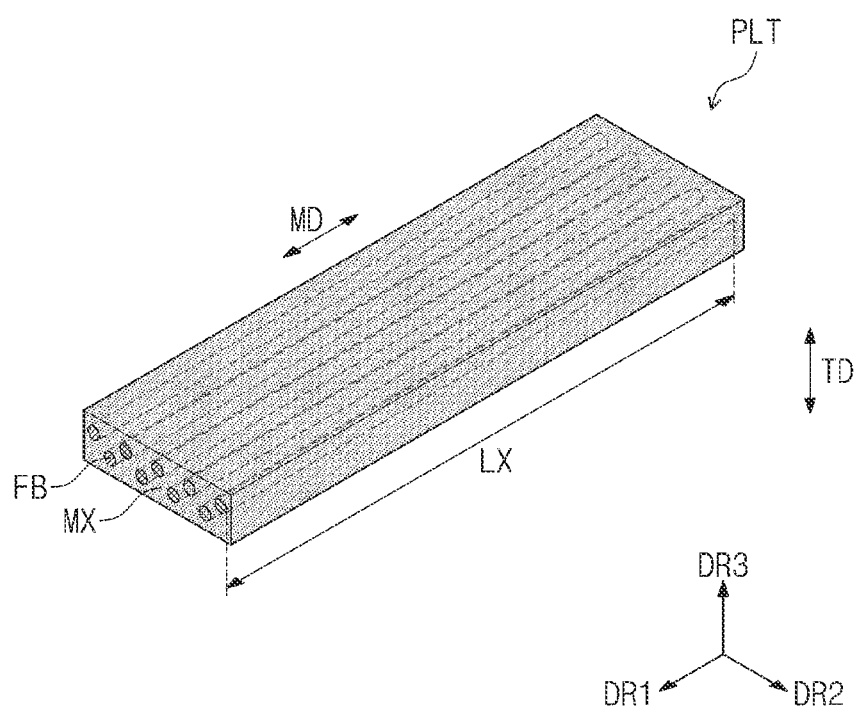
FIG. 6C is a schematic perspective view illustrating a portion of an electronic device according to an embodiment.

FIG. 6C is a schematic perspective view in which a portion of the support layer PLT according to an embodiment is enlarged. In an embodiment, the support layer PLT may include reinforcing fibers FB and a matrix portion MX. The support layer PLT may be formed of a reinforcing fiber composite material including the reinforcing fibers FB and the matrix portion MX. The reinforcing fibers FB may be arranged in a direction and dispersed in the matrix portion MX.

The reinforcing fibers FB may be carbon fibers, glass fibers, or aramid fibers. The matrix portion MX may include a polymer resin. The matrix portion MX may include a thermoplastic resin. For example, the matrix portion MX may include an epoxy-based resin, a polyamide-based resin, or a polypropylene-based resin. For example, the reinforcing fiber composite material may be a carbon fiber reinforced plastic (CFRP), a glass fiber reinforced plastic (GFRP), or an aramid fiber reinforced polymer (AFRP).

The reinforcing fibers FB extend in a direction, and are illustrated in FIG. 6C as extending in parallel with the first direction DR1. A major axis direction LX of each of the reinforcing fibers FB may be arranged in parallel with the first direction DR1. The extension direction of the reinforcing fibers FB or the long axis direction LX of the reinforcing fibers FB may correspond to a machine direction MD in a process of manufacturing the reinforcing fiber composite material. The machine direction MD may be referred to as a longitudinal direction, and a transverse direction TD direction, which is a direction perpendicular to the machine direction MD, may be referred to as a transverse direction. The reinforcing fibers FB may be composed of a set of sub-reinforcing fibers (not shown). Sub-reinforcing fibers may be bonded as one bundle to form (or constitute) one reinforcing fiber FB.

The display device according to an embodiment may be manufactured by the method for manufacturing the display device according to an embodiment. Hereinafter, a method for manufacturing a display device according to an embodiment will be described with reference to FIGS. 7A to 12B. Hereinafter, the same description may be applied to the same reference numerals as those described with reference to FIGS. 1A to 6C. In the description of FIGS. 7A to 12B, the overlapped contents which have been described in FIGS. 1A to 6C will not be described again, and description will be focused on differences.

Figure 7A:
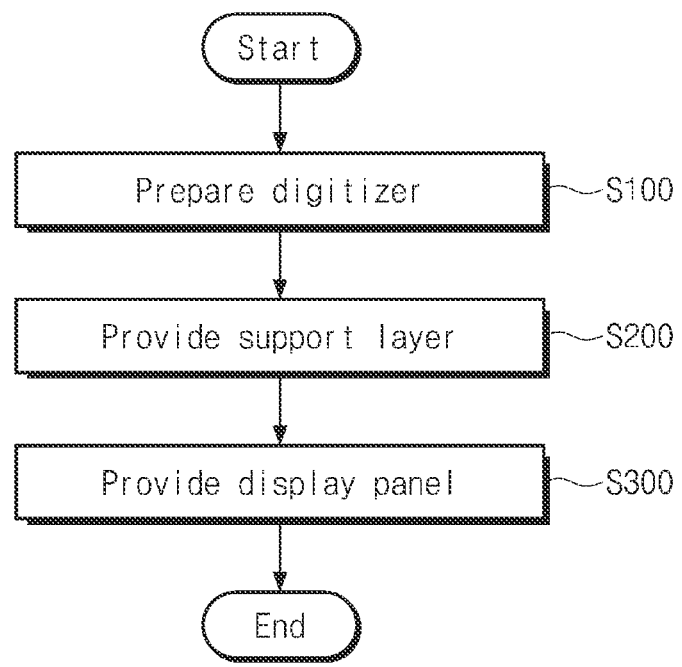
FIG. 7A is a schematic flowchart of a method for manufacturing an electronic device according to an embodiment.
Figure 7B:
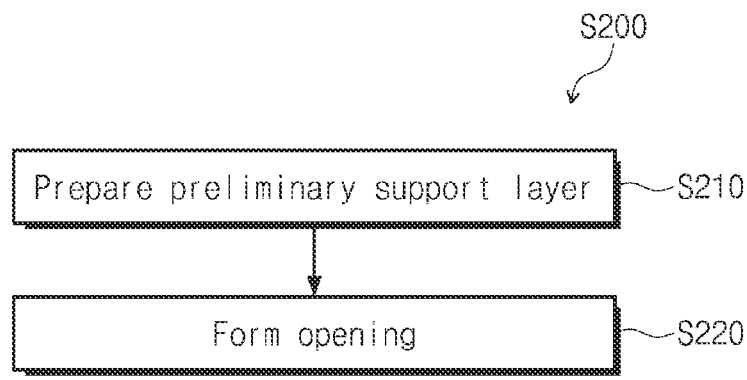
FIG. 7B is a schematic flowchart of a method for manufacturing an electronic device according to an embodiment.

FIGS. 7A and 7B are schematic flowcharts illustrating a method for manufacturing a display device according to an embodiment. FIGS. 8 to 11 schematically illustrate processes of a method for manufacturing a display device according to an embodiment.

The method for manufacturing a display device according to an embodiment may include preparing a digitizer (S100), providing a support layer (S200), and providing a display panel (S300). The support layer PLT may be provided on the digitizer DTM, and the display panel DP may be provided on the support layer PLT.

Figure 8:
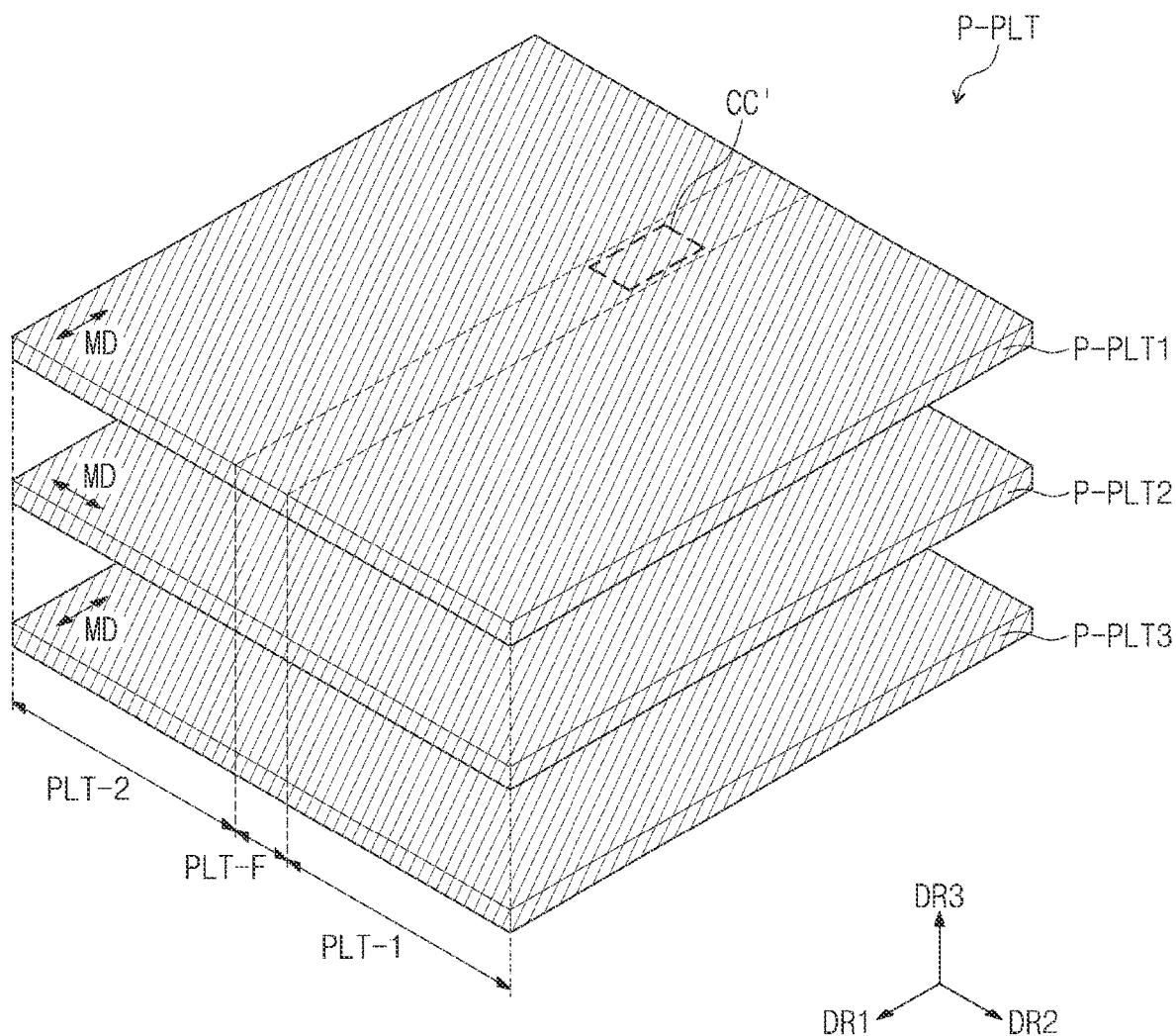
FIG. 8 is a schematic perspective view schematically illustrating a method for manufacturing an electronic device according to an embodiment.

In an embodiment, the providing of the support layer (S200) may include preparing a preliminary support layer (S210) and forming an opening (S220). The preparing of the preliminary support layer (S210) may include providing a first preliminary support layer P-PLT1, providing a second preliminary support layer P-PLT2 on the first preliminary support layer P-PLT1, providing a third preliminary support layer P-PLT3 on the second preliminary support layer P-PLT2, and compressing the provided preliminary support layers. The compressing of the provided preliminary support layers may include compressing the first preliminary support layer P-PLT1, the second preliminary support layer P-PLT2, and the third preliminary support layer P-PLT3. Referring to FIG. 8, a preliminary support layer P-PLT may include a first preliminary support layer P-PLT1, a second preliminary support layer P-PLT2, and a third preliminary support layer P-PLT3 which are sequentially stacked.

The support layer PLT (see FIGS. 6A to 6C) may be formed from the preliminary support layer P-PLT (see FIG. 8). The preliminary support layer P-PLT may include the reinforcing fiber FB (see FIGS. 6A to 6C) arranged in a direction. The preliminary support layer P-PLT may include a matrix portion MX (see FIGS. 6A to 6C) in which the reinforcing fibers FB are arranged.

The first preliminary support layer P-PLT1 may include first reinforcing fibers and a matrix portion MX (see FIGS. 6A to 6C). The third preliminary support layer P-PLT3 may include first reinforcing fibers and a matrix portion MX (see FIGS. 6A to 6C). The second preliminary support layer P-PLT2 may include second reinforcing fibers and a matrix portion MX (see FIGS. 6A to 6C). The first reinforcing fibers and the second reinforcing fibers may be the same as the reinforcing fibers FB. The matrix portions MX (see FIGS. 6A to 6C) of the first preliminary support layer P-PLT1, the second preliminary support layer P-PLT2, and the third preliminary support layer P-PLT3 may be the same as each other. As another example, the first reinforcing fibers and the second reinforcing fibers may be different reinforcing fibers. At least one of the matrix portions MX of the first preliminary support layer P-PLT1, the second preliminary support layer P-PLT2, or the third preliminary support layer P-PLT3 may be different from each other.

An extension direction of the long axis of the reinforcing fibers of the second preliminary support layer P-PLT2 disposed between the first preliminary support layer P-PLT1 and the third preliminary support layer P-PLT3 may be different from an extension direction of the long axis of the reinforcing fibers of the first preliminary support layer P-PLT1 and the third preliminary support layer P-PLT3. The extension direction of the long axis of the first reinforcing fibers and the extension direction of the long axis of the second reinforcing fibers may be different from each other.

The first preliminary support layer P-PLT1 and the third preliminary support layer P-PLT3 may each include the first reinforcing fibers arranged in the first direction DR1, and the second preliminary support layer P-PLT2 may include the second reinforcing fibers arranged in the second direction DR2. In the first preliminary support layer P-PLT1 and the third preliminary support layer P-PLT3, the long axis of the first reinforcing fibers may be parallel to the first direction DR1. In the first preliminary support layer P-PLT1 and the third preliminary support layer P-PLT3, the long axis of the first reinforcing fibers may be parallel to the extension direction of the folding axis FX (see FIGS. 1B and 1C). In the second preliminary support layer P-PLT2, the long axis of the second reinforcing fibers may be parallel to the second direction DR2.

The preliminary support layer P-PLT may be formed by compressing the first preliminary support layer P-PLT1, the second preliminary support layer P-PLT2, and the third preliminary support layer P-PLT3. In an embodiment, the preliminary support layer P-PLT may include the first support portion PLT-1 corresponding to the first non-folding region NFA10 (see FIG. 5A), the second support portion PLT-2 corresponding to the second non-folding region NFA20 (see FIG. 5A), and the folding portion PLT-F corresponding to the folding region FA0 (see FIG. 5A). The opening OP may be formed in the folding portion PLT-F of the preliminary support layer P-PLT.

Figure 9:
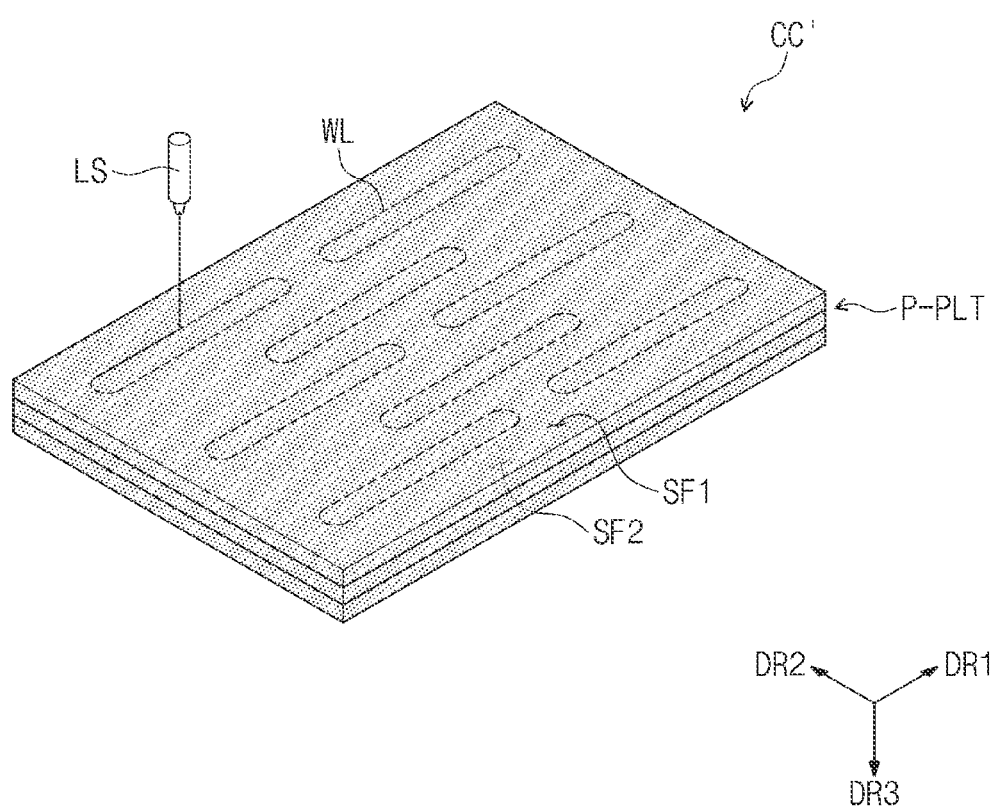
FIG. 9 is a schematic perspective view schematically illustrating a method for manufacturing an electronic device according to an embodiment.
Figure 10A:
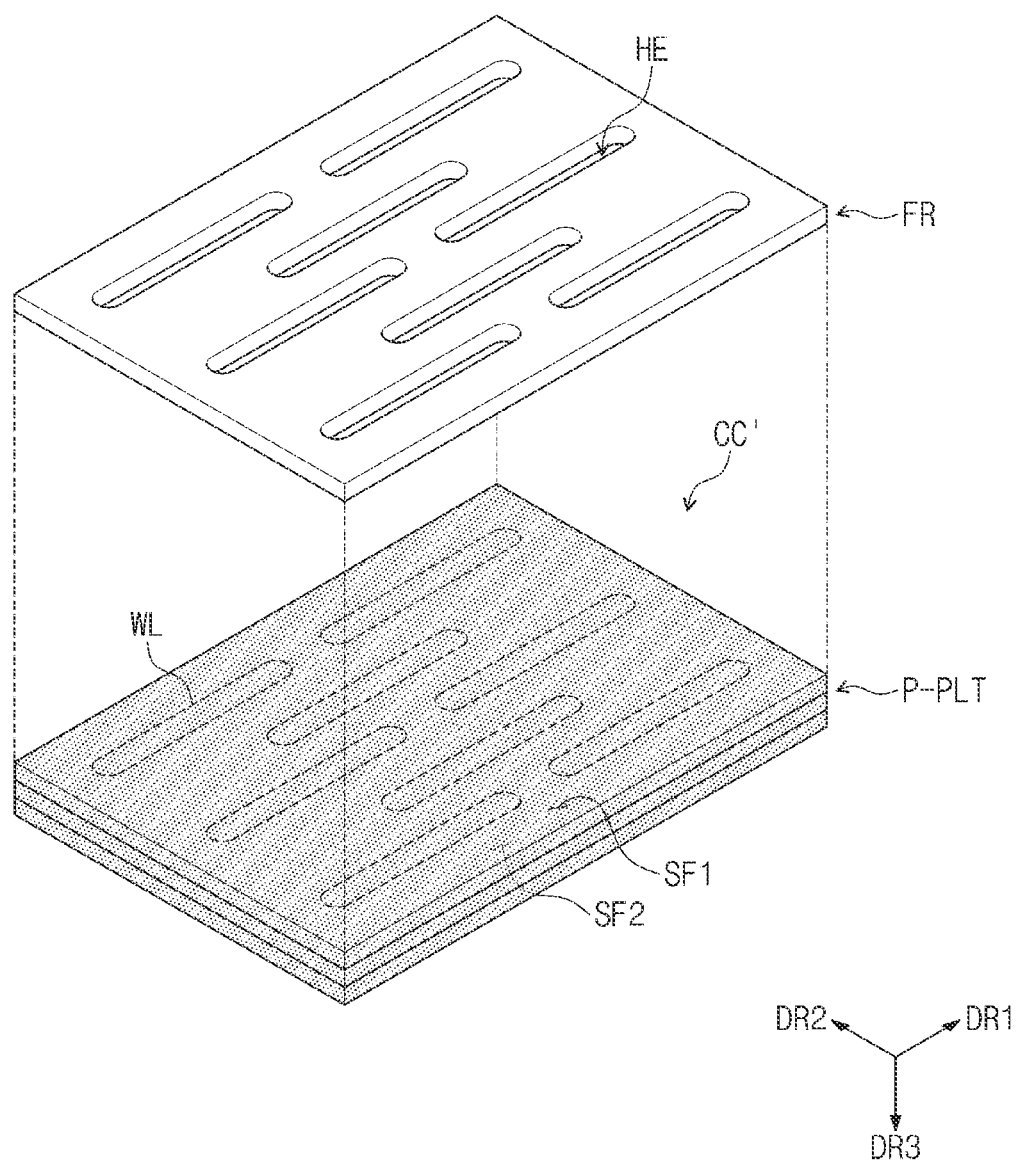
FIG. 10A is a schematic perspective view schematically illustrating a method for manufacturing an electronic device according to an embodiment.

FIGS. 9 and 10A are schematic perspective views in which region CC' of FIG. 8 is enlarged. That is, the folding portion PLT-F of the preliminary support layer P-PLT is illustrated in FIGS. 9 and 10A. Referring to FIGS. 9 and 10A, the preliminary support layer P-PLT may include one surface SF1 and the other (or another) surface SF2 facing each other. The one surface SF1 and the other surface SF2 of the preliminary support layer P-PLT may be spaced apart from each other in a direction parallel to the third direction DR3. For example, the one surface SF1 of the preliminary support layer P-PLT may be a lower surface of the preliminary support layer P-PLT, and the other surface SF2 of the preliminary support layer P-PLT may be an upper surface of the preliminary support layer P-PLT. As another example, the one surface SF1 of the preliminary support layer P-PLT may be an upper surface of the preliminary support layer P-PLT, and the other surface SF2 of the preliminary support layer P-PLT may be a lower surface of the preliminary support layer P-PLT.

According to an embodiment, the opening OP may be formed by providing a laser LS (see FIG. 9) or an abrasive agent MC (see FIG. 10B) to one surface SF1 of the preliminary support layer P-PLT. The laser LS (see FIG. 9) or the abrasive agent MC (see FIG. 10B) may be provided to the folding portion PLT-F of the preliminary support layer P-PLT. The laser LS (see FIG. 9) and the abrasive agent MC (see FIG. 10B) may not be provided to the first support portion PLT-1 and the second support portion PLT-2 of the preliminary support layer P-PLT.

FIG. 9 illustrates that the opening OP is formed by providing the laser LS to the one surface SF1 of the preliminary support layer P-PLT. The one surface SF1 of the preliminary support layer P-PLT may be a lower surface of the preliminary support layer P-PLT. A portion of the preliminary support layer P-PLT may be cut by providing the laser LS to the one surface SF1 of the preliminary support layer P-PLT. For example, the laser LS may be a nanosecond laser. The laser LS may be provided by a computer numerical control (CNC) method. Unlike that illustrated in FIG. 9, the laser LS may be provided on the other surface SF2 of the preliminary support layer P-PLT. For example, the laser LS may be provided on the upper surface of the preliminary support layer P-PLT.

As described above, the preliminary support layer P-PLT including the reinforcing fiber FB and the matrix portion MX may be cut by a laser LS. As a portion of the preliminary support layer P-PLT is cut by the laser LS, an opening OP passing through the preliminary support layer P-PLT may be formed. The laser LS may cut the preliminary support layer P-PLT while moving along a processing line WL. The processing line WL may be formed on the one surface SF1 of the preliminary support layer P-PLT to form the opening OP.

Figure 10B:
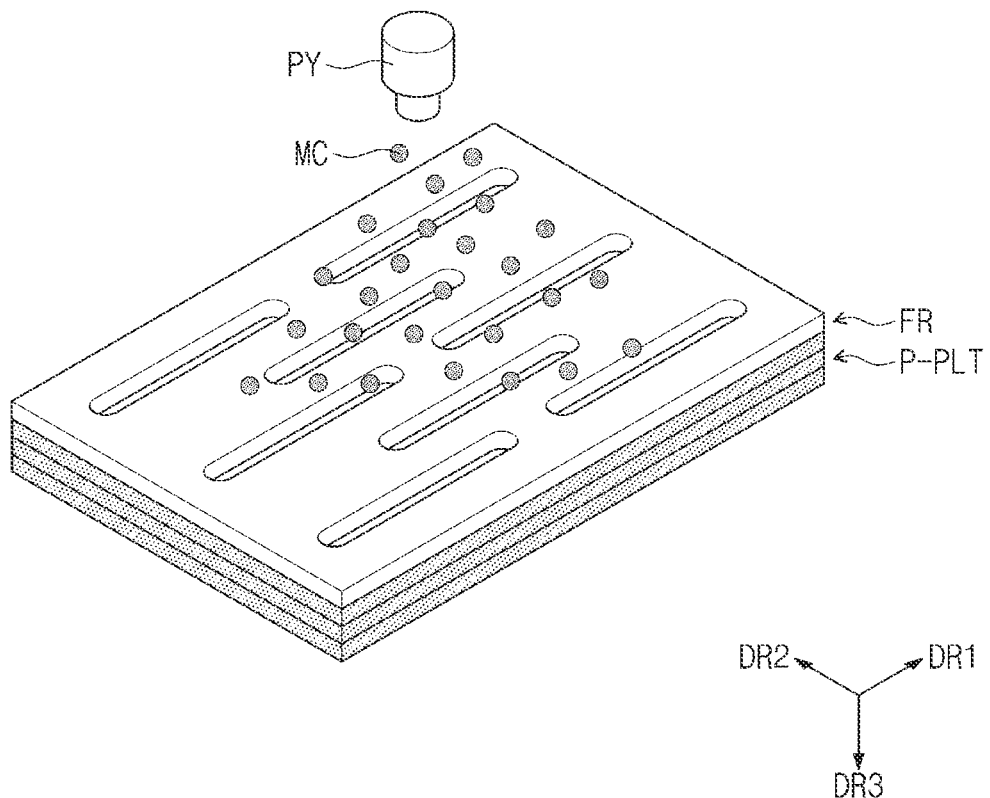
FIG. 10B is a schematic perspective view schematically illustrating a method for manufacturing an electronic device according to an embodiment.

Unlike FIG. 9, FIGS. 10A and 10B illustrate that the opening OP is formed by providing the abrasive agent MC to the one surface SF1 of the preliminary support layer P-PLT. According to an embodiment, the forming of the opening (S220) may further include providing a patterning film FR on the one surface SF1 of the preliminary support layer P-PLT. Prior to the providing of the abrasive agent MC, the method may further include providing the patterning film FR. Unlike illustrated in FIGS. 10A and 10B, the patterning film FR and the abrasive agent MC may be provided on the other surface SF2 of the preliminary support layer P-PLT. For example, the patterning film FR and the abrasive agent MC may be provided on the upper surface of the preliminary support layer P-PLT.

According to an embodiment, the patterning film FR may have a hole HE defined therein, and the hole HE may be designed to form an opening OP. The hole HE of the patterning film FR may be a portion through which the abrasive agent MC passes. The abrasive agent MC may not pass through a region of the patterning film FR except for the hole HE.

One surface SF1 of the preliminary support layer P-PLT may be exposed in (and through) the hole HE of the patterning film FR. The abrasive agent MC may be provided on the one surface SF1 of the preliminary support layer P-PLT exposed through the hole HE, so that the one surface SF1 of the preliminary support layer P-PLT may be cut. As the one surface SF1 of the preliminary support layer P-PLT is cut, an opening OP passing through the support layer PLT may be formed.

After the patterning film FR is provided on the one surface SF1 of the preliminary support layer P-PLT, the abrasive agent MC may be provided on the patterning film FR. For example, the patterning film FR may be a dry film resist (DFR). The abrasive agent MC may be provided by means of a spraying device PY.

The abrasive agent MC may include abrasive particles. The average diameter of the particles included in the abrasive agent MC may be in a range of about 20 um to about 50 um. For example, the abrasive agent MC may include alumina oxide, glass beads, or silicon carbide, and the average diameter of the particles may be about 30 um. However, this is an example, and the type and size of the abrasive agent MC are not limited thereto.

In case that the preliminary support layer P-PLT includes a metal, an etching process is used to form an opening in the metal. As another example, in the display device DD according to an embodiment, the support layer PLT may include the reinforcing fiber FB. As the support layer PLT includes the reinforcing fiber FB, it is possible to provide a display device DD that is lightened and maintains folding reliability.

As a method for manufacturing a display device DD according to an embodiment for manufacturing the display device DD provides the laser LS or the abrasive agent MC to form the openings OP and OP-a, the method may form the openings OP and OP-a suitable for the support layer PLT including the reinforcing fiber FB.

Figure 11:
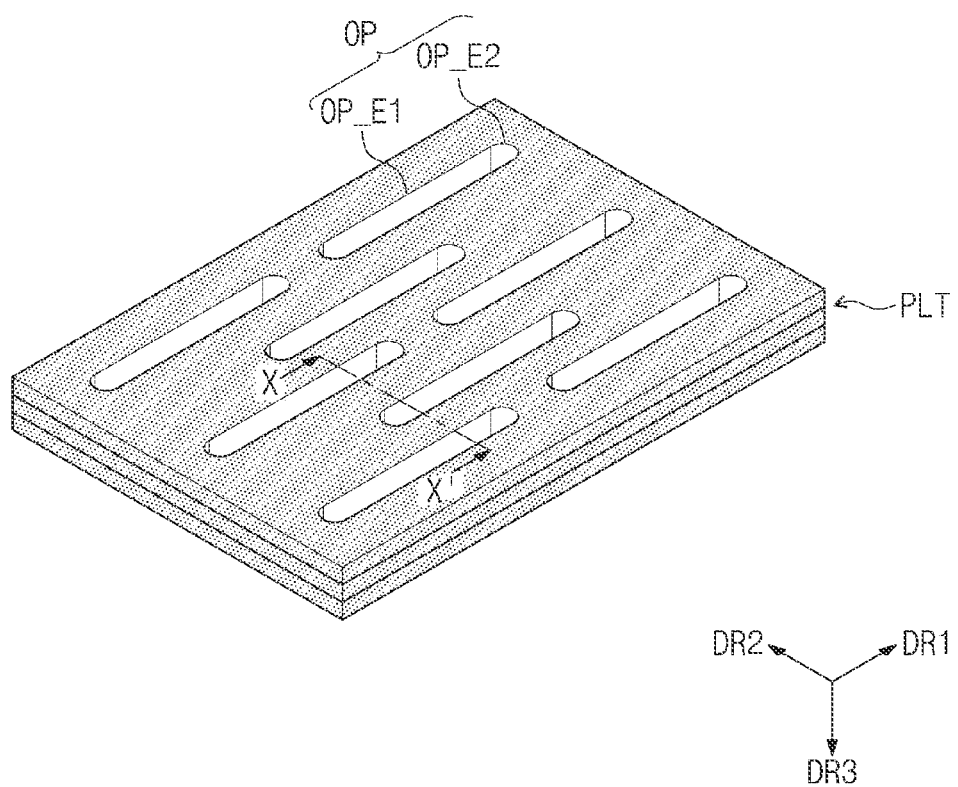
FIG. 11 is a schematic perspective view illustrating a portion of an electronic device according to an embodiment.

FIG. 11 is a schematic perspective view illustrating a support layer PLT in which the opening OP is formed by providing the laser LS or the abrasive agent MC. On a plane defined by the first direction DR1 and the second direction DR2, the opening OP may include a first edge OP_E1 and a second edge OP_E2 extending from the first edge OP_E1. The first edge OP_E1 may be parallel to the first direction DR1, and the second edge OP_E2 may have a curvature. For example, on a plane defined by the first direction DR1 and the second direction DR2, the first edge OP_E1 may have a straight shape, and the second edge OP_E2 may have a curved shape. For example, the second edge OP_E2 may be a portion of a circumference of the opening OP.

In case that the laser LS is provided to form the opening OP, the first edge OP_E1 and the second edge OP_E2 of the opening OP may be formed more precisely. Multiple openings OP may be formed, and differences in size and shape of the multiple openings OP may be minimized.

In case that the laser LS is provided to form the opening OP, the second edge OP_E2 may correspond to a heat affected zone (HAZ) formed by the laser LS. The second edge OP_E2 is formed in a curved shape, so that the heat affected zone by the laser LS can be observed. In case that the laser LS is provided to form the opening OP, the second edge OP_E2 formed in a curved shape may take longer than the first edge OP_E1 in a straight line.

The method for manufacturing a display device according to an embodiment may further include cleaning the support layer PLT in which the opening OP is formed. The method for manufacturing a display device may further include cleaning the support layer PLT after forming the opening OP. The method may further include removing the patterning film FR from the support layer PLT in which the opening OP is formed, and may perform cleaning the support layer PLT before and after removing the patterning film FR. In the cleaning of the support layer PLT, ultrapure water (deionized (DI) water), etc., suitable for semiconductor manufacturing may be used as a cleaning material. However, this is an example, and the cleaning material used in the cleaning is not limited thereto.

Figure 12A:
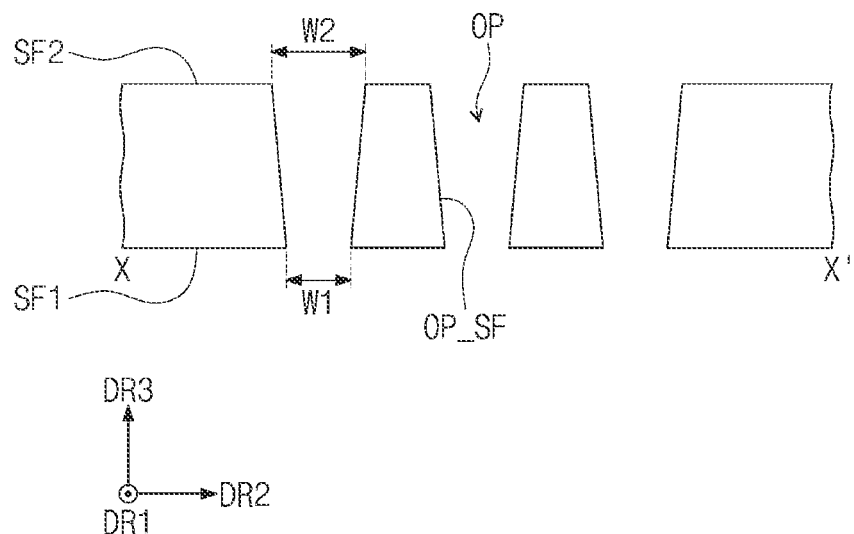
FIG. 12A is a schematic cross-sectional view illustrating a portion of an electronic device according to an embodiment.
Figure 12B:
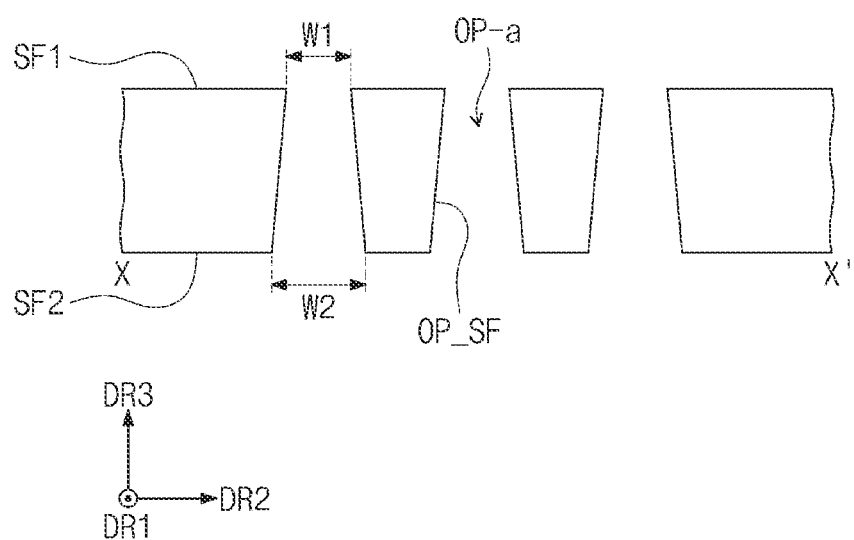
FIG. 12B is a cross-sectional view illustrating a portion of an electronic device according to an embodiment.

FIGS. 12A and 12B are schematic cross-sectional views illustrating a portion corresponding to line X-X' of FIG. 11. FIGS. 12A and 12B illustrate in more detail the openings OP and OP-a of the support layer PLT according to an embodiment. Referring to FIG. 12A, the opening OP may have an inverted trapezoidal shape in a cross-sectional view. As another example, referring to FIG. 12B, the opening OP-a may have a trapezoidal shape in a cross-sectional view. The openings OP and OP-a may have a trapezoidal shape including a side surface OP_SF inclined with respect to one surface SF1 and the other surface SF2.

In the specification, the trapezoidal shape may have a short side disposed at an upper side thereof and a long side disposed at a lower side thereof in the extension direction of the third direction DR3. In the specification, the inverted trapezoidal shape may have a short side disposed at a lower side thereof and a long side disposed at an upper side thereof in the extension direction of the third direction DR3.

According to an embodiment, the openings OP and OP-a may have a trapezoidal shape or an inverted trapezoidal shape on a cross section defined by the second direction DR2 and the third direction DR3. The openings OP and OP-a formed by providing the laser LS or the abrasive agent MC to the preliminary support layer P-PLT may have a trapezoidal shape or an inverted trapezoidal shape.

Referring to FIGS. 12A and 12B, the openings OP and OP-a may have a first width W1 on one surface SF1 of the support layer PLT and a second width W2 on the other surface SF2 of the support layer PLT. On a cross section defined by the second direction DR2 and the third direction DR3, the first width W1 and the second width W2 may be parallel to the second direction DR2. The first width W1 of the openings OP and OP-a may be different from the second width W2 of the openings OP and OP-a. For example, the first width W1 of the openings OP and OP-a may be smaller than the second width W2 of the openings OP and OP-a.

In case that one surface SF1 of the support layer PLT is the lower surface of the support layer PLT and the other surface SF2 of the support layer PLT is the upper surface of the support layer PLT, the opening OP may have an inverted trapezoid shape. The opening OP having a first width W1 on the lower surface of the support layer PLT and a second width W2 greater than the first width W1 on the upper surface of the support layer PLT may have an inverted trapezoid shape.

As another example, in case that one surface SF1 of the support layer PLT is the upper surface of the support layer PLT and the other surface SF2 of the support layer PLT is the lower surface of the support layer PLT, the opening OP-a may have a trapezoidal shape. The opening OP-a having a first width W1 on the upper surface of the support layer PLT and a second width W2 greater than the first width W1 on the lower surface of the support layer PLT may have a trapezoidal shape.

As illustrated in FIG. 9, in case that the openings OP and OP-a are formed by providing the laser LS to the preliminary support layer P-PLT, the difference between the first width W1 and the second width W2 may be in a range of about 10 um to about 20 um. In case that the opening OP is formed by providing the laser LS on a surface SF1 of the preliminary support layer P-PLT, the first width W1 on the surface SF1 may be smaller than the second width W2 on the other surface SF2 by about 10 um to about 20 um.

As illustrated in FIGS. 10A and 10B, in case that the openings OP and OP-a are formed by providing the abrasive agent MC to the preliminary support layer P-PLT, a difference between the first width W1 and the second width W2 may be in a range of about 20 um to about 30 um. In case that the opening OP is formed by providing the abrasive agent MC on a surface SF1 of the preliminary support layer P-PLT, the first width W1 on one surface SF1 may be smaller than the second width W2 on the other surface SF2 by about 20 um to about 30 um.

On a cross section defined by the second direction DR2 and the third direction DR3, the shapes of the openings OP and OP-a may vary depending on a method for forming the openings OP and OP-a. In a cross-sectional view, the shape of the openings OP and OP-a may vary depending on whether the laser LS provided to form the openings OP and OP-a is provided on one surface SF1 of the preliminary support layer P-PLT or the preliminary support layer P-PLT is provided on the other surface SF2. In a cross-sectional view, the shapes of the openings OP and OP-a may vary depending on whether the abrasive agent MC provided to form the openings OP and OP-a is provided on one surface SF1 of the preliminary support layer P-PLT or the preliminary support layer P-PLT is provided on the other surface SF2.

In case that the laser LS or the abrasive agent MC is provided to the lower surface (e.g., SF1 of FIG. 12A) of the preliminary support layer P-PLT to form the opening OP, the opening OP may have an inverted trapezoidal shape as illustrated in FIG. 12A. In case that the surface on which the laser LS or the abrasive agent MC is provided is the lower surface of the preliminary support layer P-PLT, the first width W1 of the opening OP on the lower surface of the support layer PLT formed from the preliminary support layer P-PLT may be smaller than the second width W2 of the opening OP on the upper surface of the support layer PLT formed from the preliminary support layer P-PLT.

As another example, in case that the laser LS or the abrasive agent MC is provided to the upper surface (e.g., SF1 of FIG. 12B) of the preliminary support layer P-PLT to form the opening OP-a, the opening OP-a may have a trapezoidal shape as illustrated in FIG. 12B. In case that the surface on which the laser LS or the abrasive agent MC is provided is the upper surface of the preliminary support layer P-PLT, the first width W1 of the opening OP-a on the upper surface of the support layer PLT formed from the preliminary support layer P-PLT may be smaller than the second width W2 of the opening OP-a on the lower surface of the support layer PLT formed from the preliminary support layer P-PLT.

A method for manufacturing a display device according to an embodiment may include forming an opening in a folding portion of the preliminary support layer. A laser or an abrasive agent may be provided on the folding portion of the preliminary support layer. The method for manufacturing a display device according to an embodiment may include forming the opening by providing a laser or an abrasive agent, thereby exhibiting a characteristic that facilitate the formation of an openings in a support layer including a reinforcing fiber.

An electronic device according to an embodiment may include a display device and an electro-optical module, and the display device according to an embodiment may be manufactured according to a method for manufacturing a display device. The display device may include a display panel, a support layer disposed under the display panel, and a digitizer disposed under the support layer. The display panel may include a first non-folding region, a second non-folding region, and a folding region disposed between the first non-folding region and the second non-folding region. The support layer may include one surface and the other surface having an opening defined therein and facing each other. The first width of the opening on one surface and the second width of the opening on the other surface may be different. The opening of the support layer may be formed in a folding portion corresponding to the folding region of the display panel. Accordingly, the electronic device may exhibit a characteristic of being readily foldable.

A method for manufacturing a display device of an embodiment may include using a laser or an abrasive agent, thereby forming an opening in a support layer including a reinforcing fiber.

A display device and an electronic device including the display device of an embodiment may include a support layer including a reinforcing fiber, thereby exhibiting characteristics in which the weight is reduced and the folding reliability is maintained.

Although the disclosure has been described with reference to an embodiment of the disclosure, it will be understood that the disclosure should not be limited to these embodiments but various changes and modifications can be made by those skilled in the art without departing from the spirit and scope of the disclosure.

Accordingly, the technical scope of the claimed invention is not intended to be limited to the contents set forth in the detailed description of the specification, but is intended to be defined by the appended claims.

What is claimed is:

1. A display device comprising:
   a display panel including:
      a folding region that is folded with reference to a folding axis extending in a first direction; and
      a first non-folding region and a second non-folding region disposed with the folding region disposed between the first and second non-folding regions;
   a support layer disposed under the display panel and overlapping the first non-folding region, the second non-folding region, and the folding region and having an opening formed therein, the support layer being integrally formed so as to be of a single-piece construction; and
   a digitizer disposed under the support layer, wherein
   the support layer is formed of a reinforcing fiber in the folding region and includes one surface and another surface facing each other,
   a first width of the opening on the one surface in a second direction and a second width of the opening on the another surface in the second direction are different from each other, and
   the second direction is perpendicular to the first direction.

2. The display device of claim 1, wherein the display panel comprises a sensing region spaced apart from the folding region.

3. The display device of claim 1, wherein on a cross section perpendicular to the one surface and the another surface, the opening has a trapezoidal shape or an inverted trapezoidal shape having a side surface inclined with respect to the one surface or the another surface.

4. The display device of claim 1, the opening overlaps the folding region in a plan view.

5. The display device of claim 1, further comprising:
   a cover layer disposed on the one surface or the another surface,
   wherein the cover layer overlaps the opening in a plan view.

6. The display device of claim 1, further comprising:
   an adhesive layer disposed between the support layer and the digitizer and not overlapping the folding region in a plan view.

7. The display device of claim 1, wherein
   the digitizer comprises:
      a first digitizer; and
      a second digitizer, wherein
   the first and second digitizers do not overlap the folding region in a plan view, and
   the first and second digitizers are spaced apart from each other.

8. The display device of claim 1, wherein the support layer is formed of multiple reinforcing fibers in the folding region that are arranged in parallel with one another in the first direction.

9. The display device of claim 8, wherein
   the support layer includes multiple elongated openings in the folding region that are spaced apart from each other and extend in the first direction, and
   the multiple reinforcing fibers are disposed between the multiple elongated openings and are separated from the multiple elongated openings in the second direction.

10. An electronic device comprising:
    a display device including a sensing region through which an optical signal passes;
    an electro-optical module disposed to correspond to the sensing region;
    a control module that controls the display device and the electro-optical module; and
    a housing in which the display device, the electro-optical module, and the control module are accommodated, wherein
    the display device includes:
       a display panel including:
          a folding region that is folded with reference to a folding axis extending in a first direction; and
          a first non-folding region and a second non-folding region disposed with the folding region disposed between the first and second non-folding regions;
       a support layer disposed under the display panel and overlapping the first non-folding region, the second non-folding region, and the folding region and having an opening formed therein, the support layer being integrally formed so as to be of a single-piece construction;
       a digitizer disposed under the support layer; and
       the support layer is formed of a reinforcing fiber in the folding region and includes one surface and another surface facing each other,
       a first width of the opening on the one surface in a second direction and a second width of the opening on the another surface in the second direction are different from each other, and
       the second direction is perpendicular to the first direction.

11. The electronic device of claim 10, wherein
    the support layer comprises:
       a first support portion corresponding to the first non-folding region;
       a second support portion corresponding to the second non-folding region; and
       a folding portion corresponding to the folding region, and
    the opening is formed in the folding portion.

12. The electronic device of claim 10, wherein on the cross section perpendicular to the one surface and the another surface, the opening has a trapezoidal shape or an inverted trapezoidal shape having a side surface inclined with respect to the one surface or the another surface.

* * * * *